United States Patent
Yasutake

(10) Patent No.: US 8,450,714 B2
(45) Date of Patent: May 28, 2013

(54) SEMICONDUCTOR MEMORY DEVICE INCLUDING VARIABLE RESISTANCE ELEMENT OR PHASE-CHANGE ELEMENT

(75) Inventor: Nobuaki Yasutake, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 141 days.

(21) Appl. No.: 12/879,424

(22) Filed: Sep. 10, 2010

(65) Prior Publication Data

US 2011/0227017 A1    Sep. 22, 2011

(30) Foreign Application Priority Data

Mar. 19, 2010  (JP) ................................. 2010-064735

(51) Int. Cl.
*H01L 45/00*         (2006.01)
(52) U.S. Cl.
USPC ............. 257/3; 257/4; 257/E45.002; 365/148
(58) Field of Classification Search
USPC ........................ 257/2, 3, 4, E45.002; 356/148
See application file for complete search history.

(56) References Cited

U.S. PATENT DOCUMENTS

| | | | |
|---|---|---|---|
| 2008/0111120 A1* | 5/2008 | Lee et al. .......................... | 257/2 |
| 2008/0191188 A1* | 8/2008 | Jeong .............................. | 257/4 |
| 2008/0237566 A1* | 10/2008 | An et al. .......................... | 257/4 |
| 2008/0280390 A1* | 11/2008 | Kim et al. ....................... | 438/95 |
| 2008/0315174 A1* | 12/2008 | Kang et al. ...................... | 257/4 |
| 2008/0315359 A1* | 12/2008 | Happ et al. ...................... | 257/537 |
| 2009/0230505 A1* | 9/2009 | Dennison ....................... | 257/522 |
| 2010/0044669 A1* | 2/2010 | Happ et al. ...................... | 257/3 |
| 2010/0078618 A1* | 4/2010 | Xiao et al. ....................... | 257/3 |
| 2010/0108971 A1* | 5/2010 | Lee et al. ......................... | 257/2 |
| 2010/0117046 A1* | 5/2010 | Chang et al. ................... | 257/3 |

FOREIGN PATENT DOCUMENTS

| | | |
|---|---|---|
| JP | 2007-19559 | 1/2007 |
| JP | 2009-123900 | 6/2009 |
| WO | WO 2009/128142 A1 | 10/2009 |

OTHER PUBLICATIONS

U.S. Appl. No. 12/889,558, filed Sep. 24, 2010, Tsukamoto, et al.

* cited by examiner

*Primary Examiner* — Jerome Jackson, Jr.
*Assistant Examiner* — Paul Budd
(74) *Attorney, Agent, or Firm* — Oblon, Spivak, McClelland, Maier & Neustadt, L.L.P.

(57) ABSTRACT

According to one embodiment, a semiconductor memory device includes a first conductive line, a second conductive line, a cell unit, a silicon nitride film, and an insulating film. The first conductive line extends in a first direction. The second conductive line extends in a second direction crossing the first direction. The cell unit includes a phase-change film and a diode including a p-type semiconductor layer and an n-type semiconductor layer. The cell unit is connected in series between the first conductive line and the second conductive line. The silicon nitride film is formed on a side surface of the phase-change film. The insulating film is formed on a side surface of the diode and has a smaller amount of charge trapping than the silicon nitride film.

15 Claims, 20 Drawing Sheets

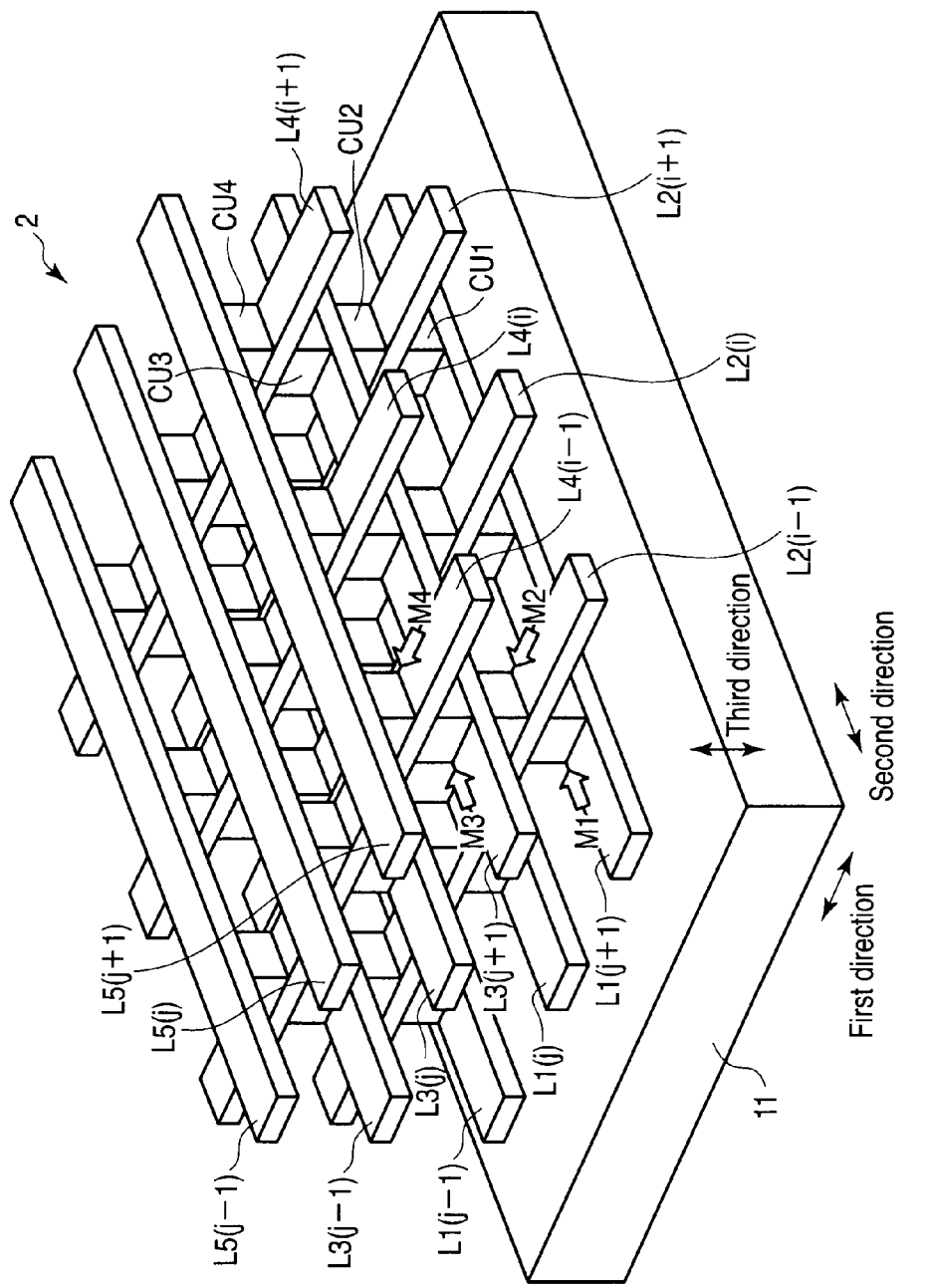
F I G. 2

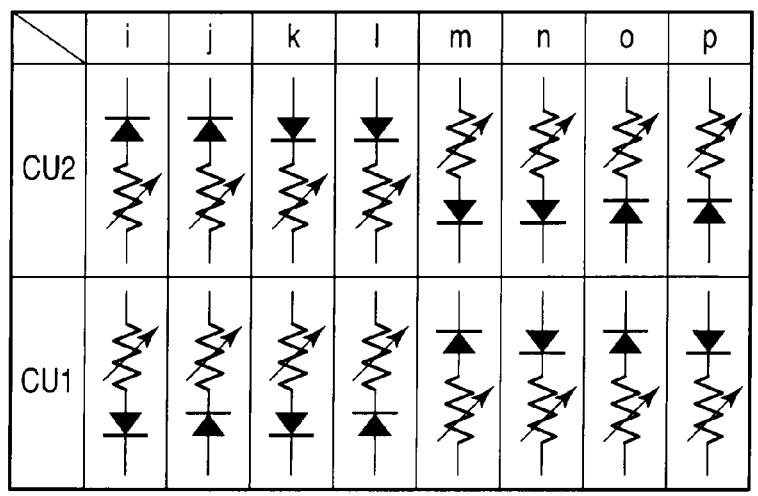
F I G. 5
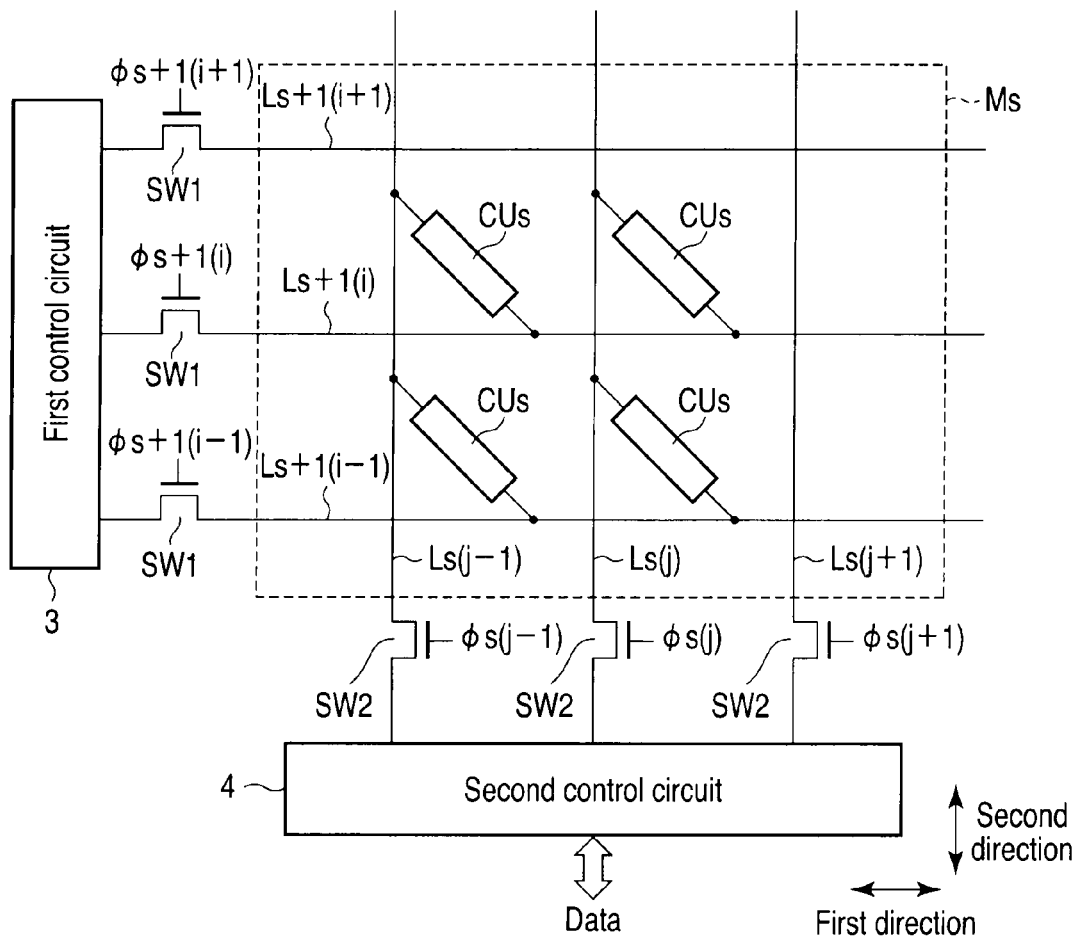
F I G. 6

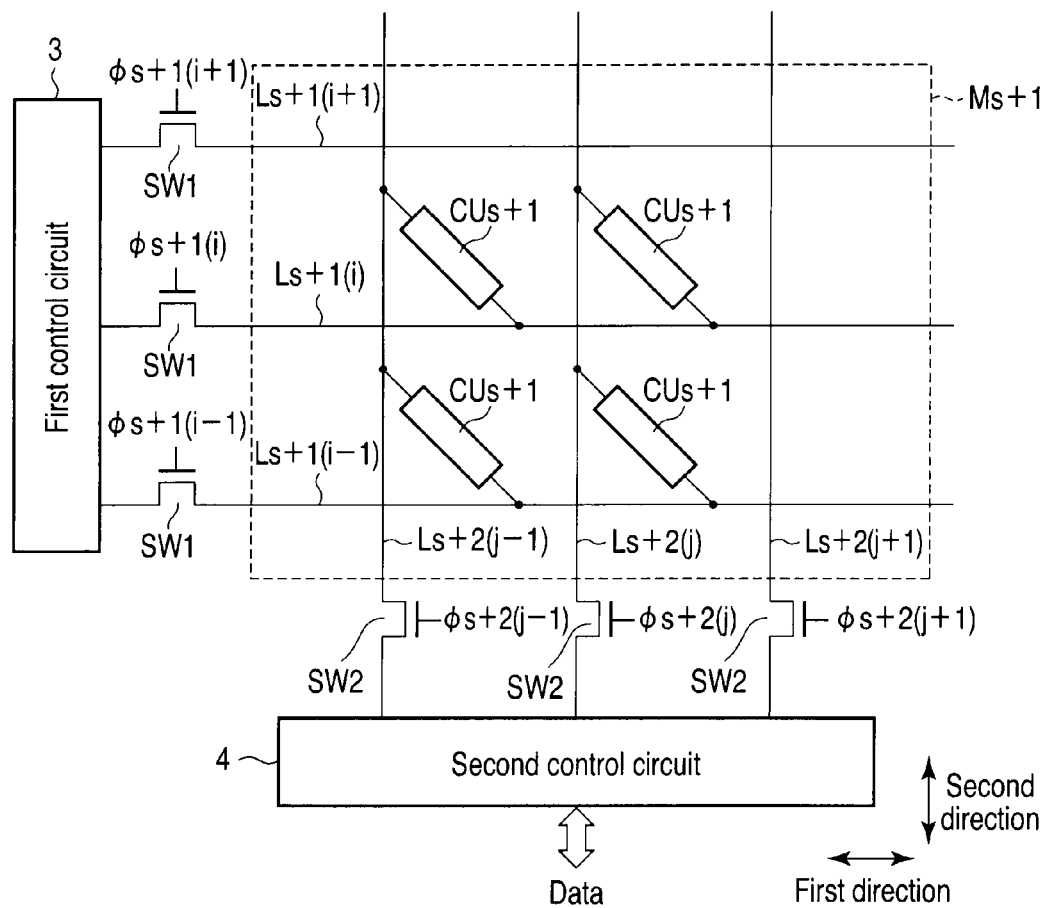
F I G. 7

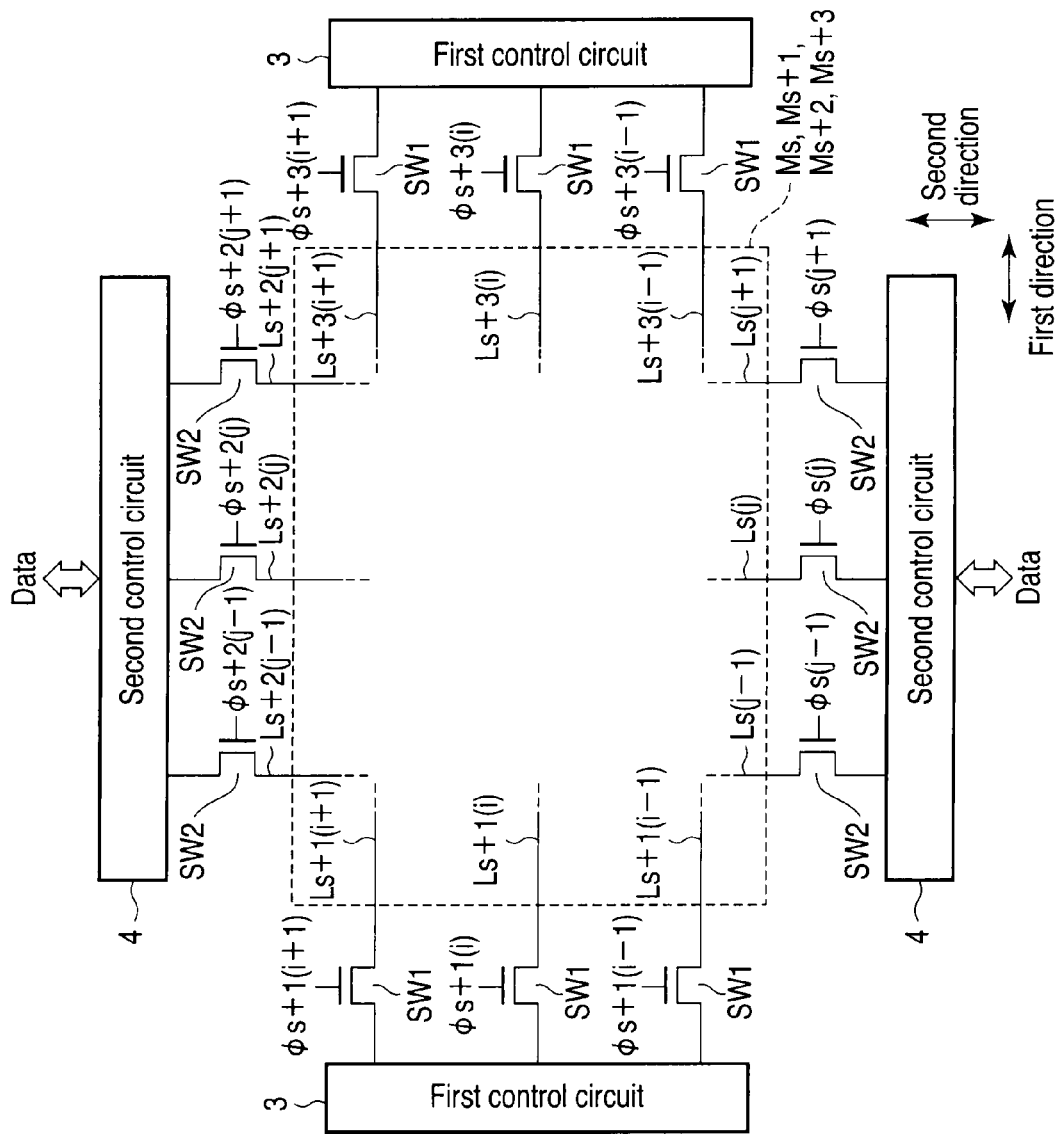
F I G. 8

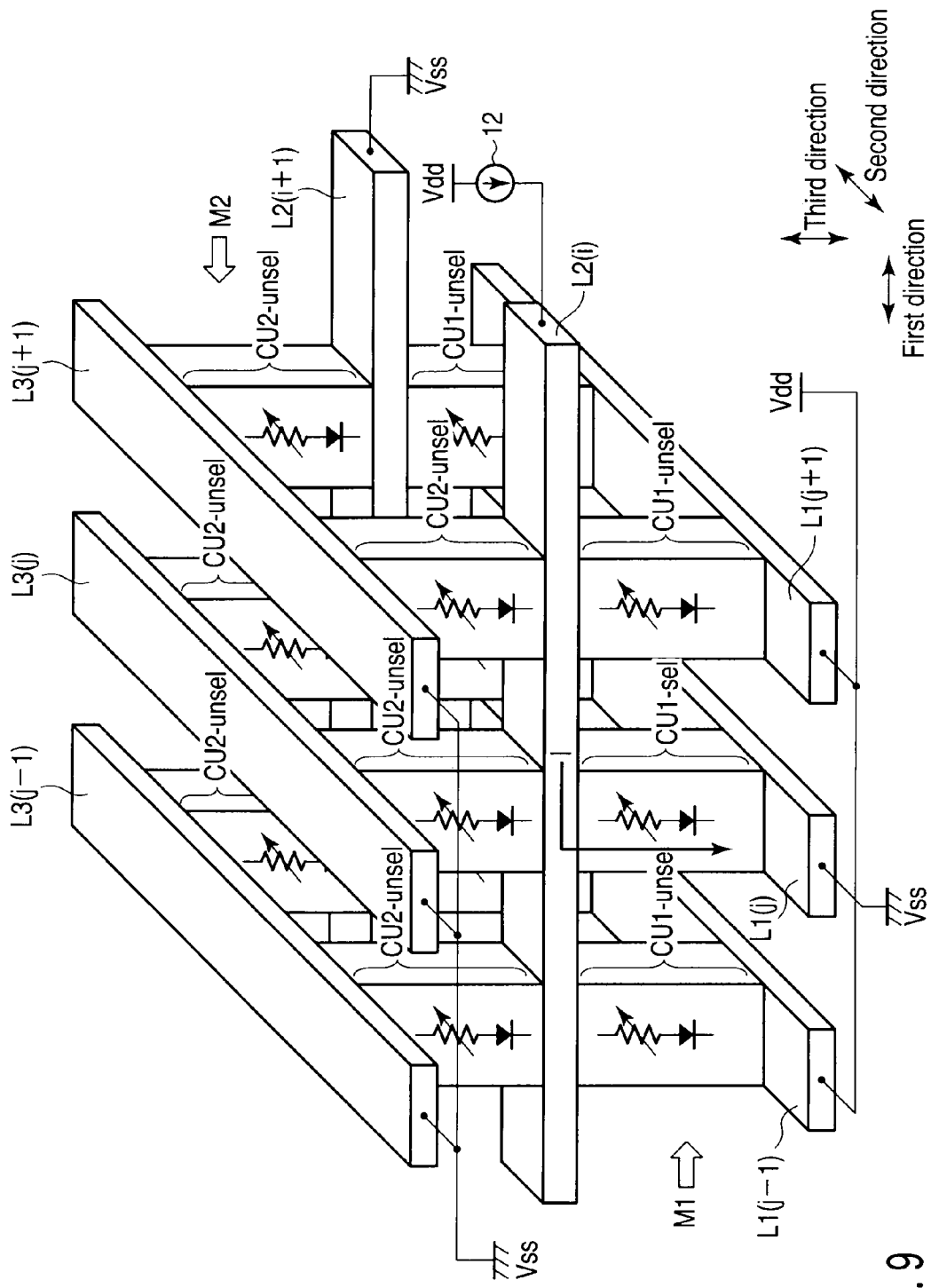
F I G. 9

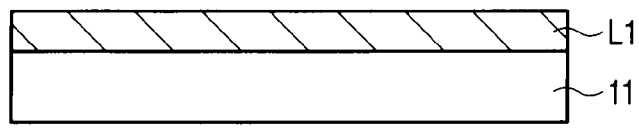
F I G. 16
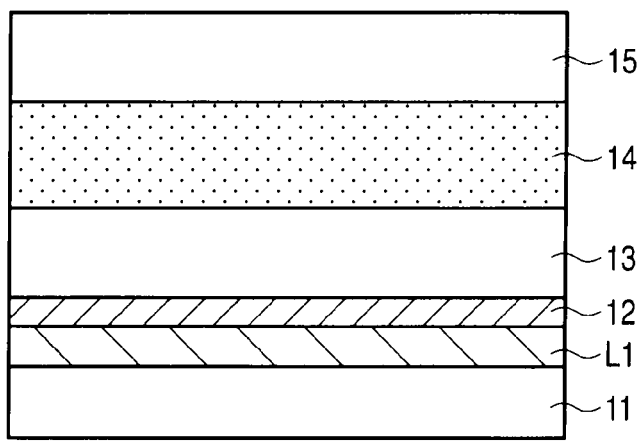
F I G. 17
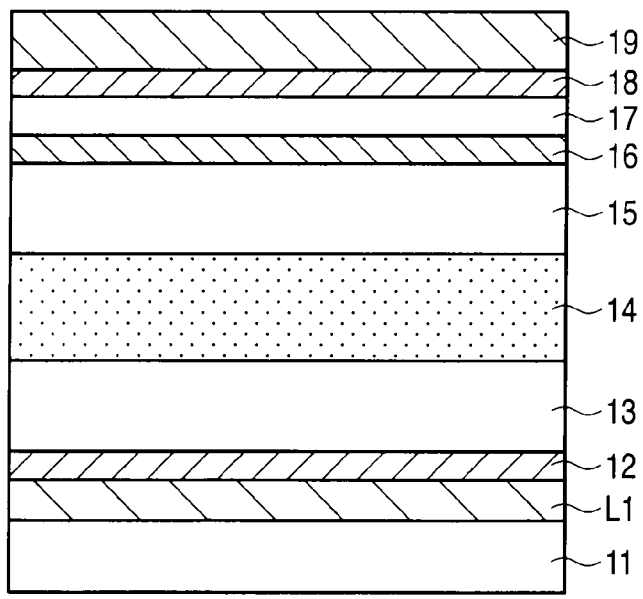
F I G. 18

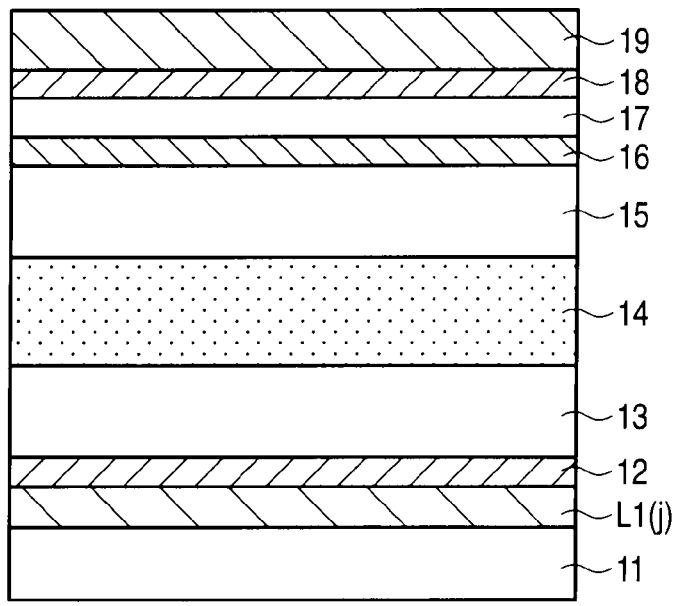
F I G. 23
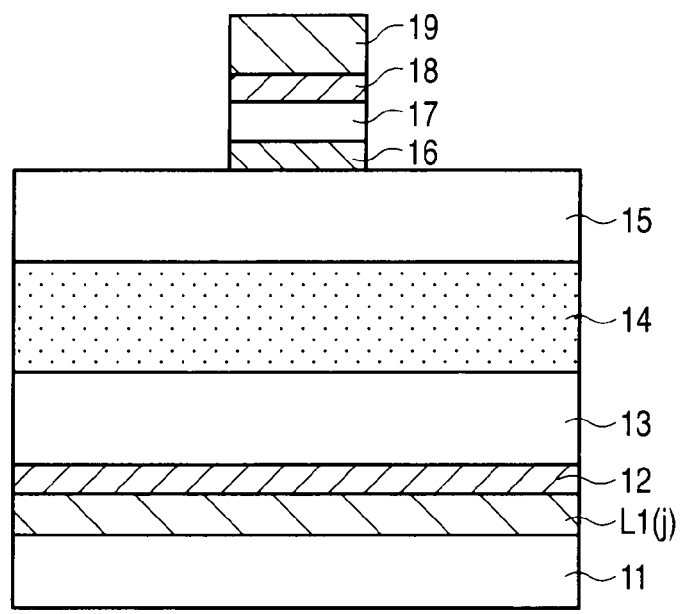
F I G. 24

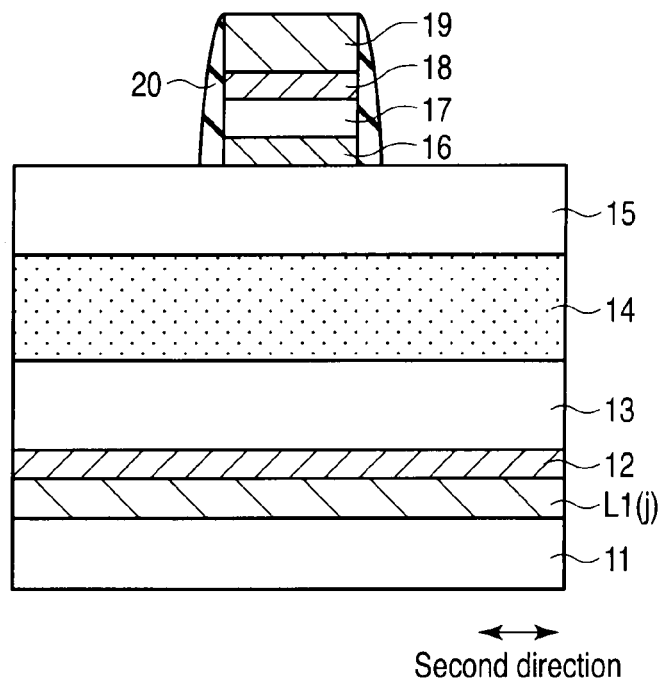
F I G. 25
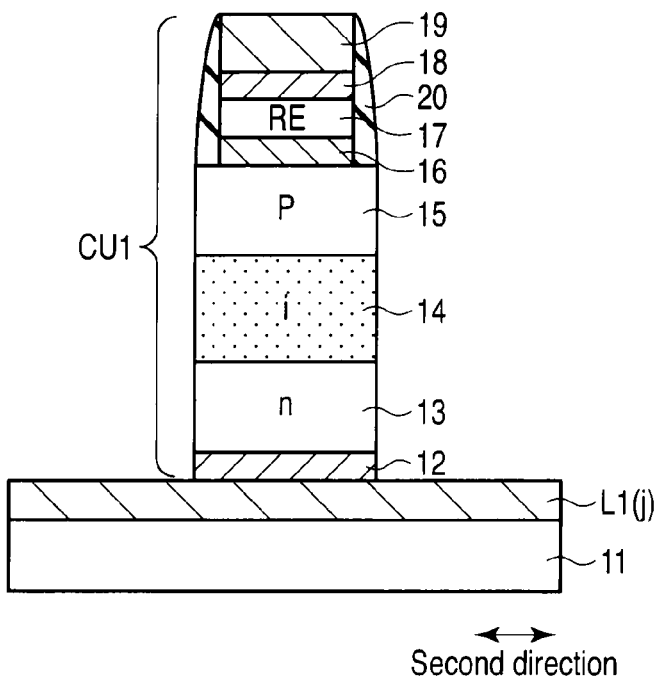
F I G. 26

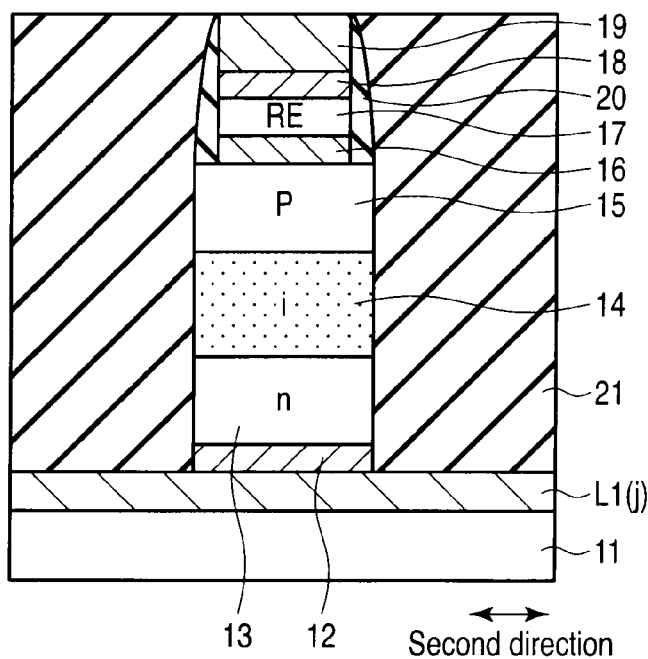
F I G. 27
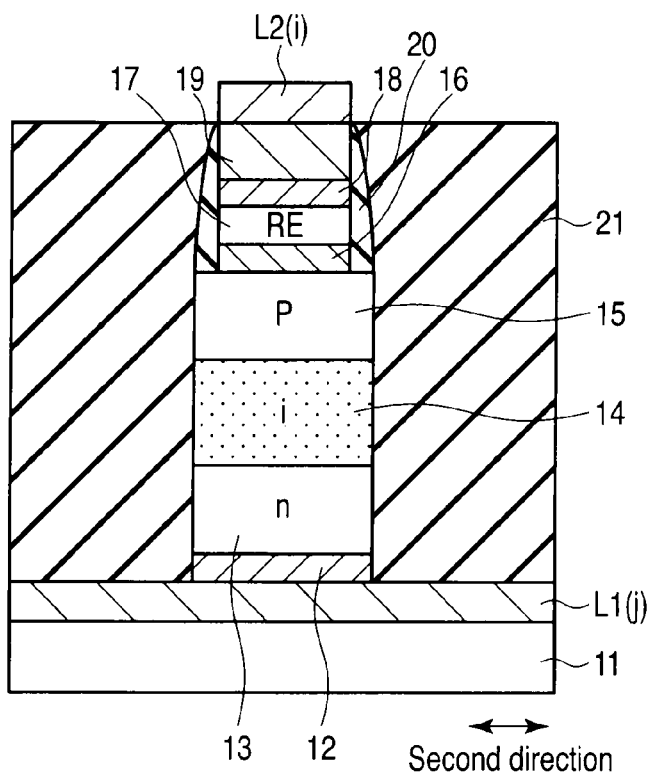
F I G. 28

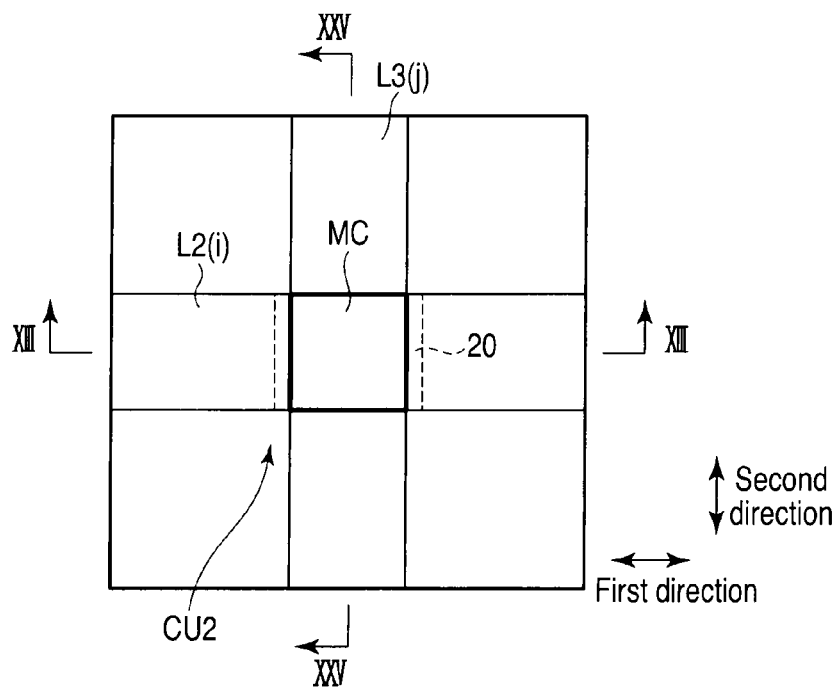
F I G. 29A
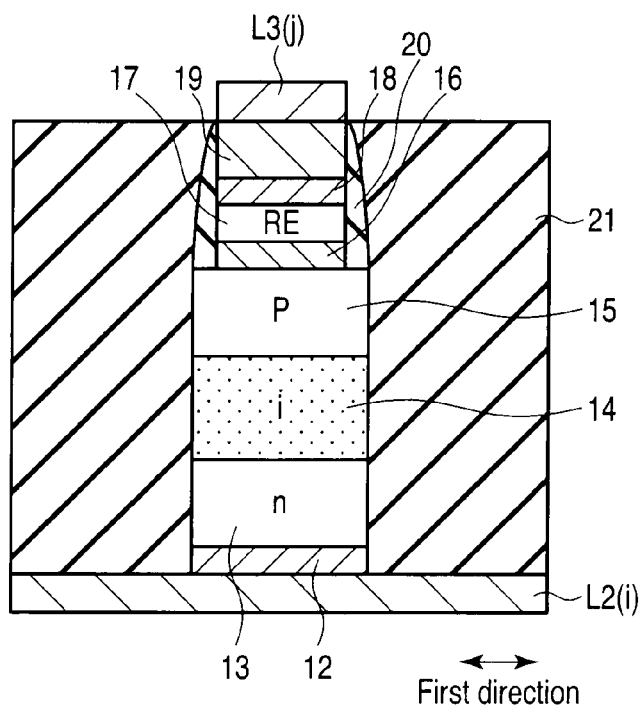
F I G. 29B

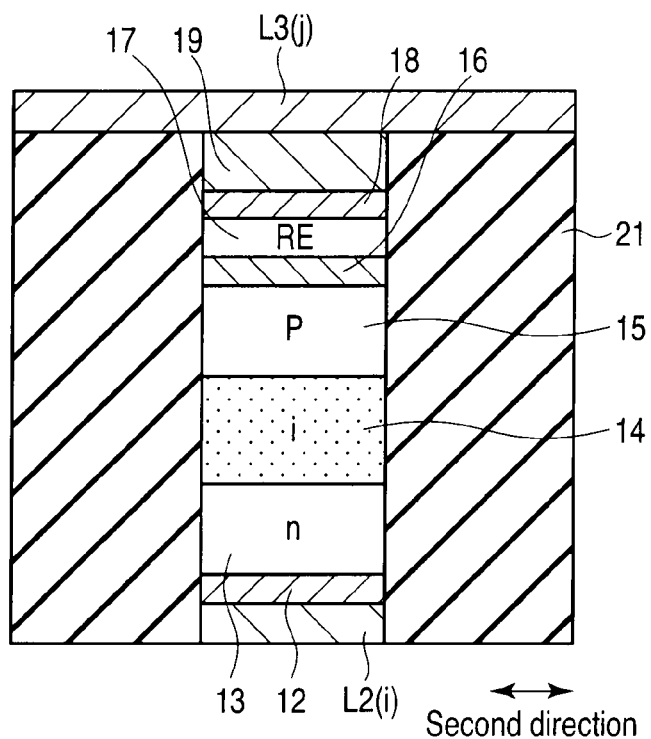
F I G. 29C
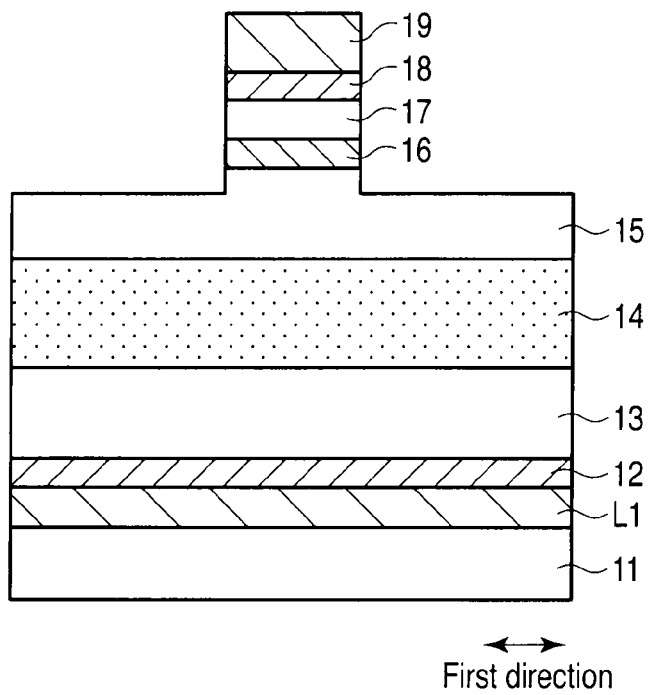
F I G. 30

SEMICONDUCTOR MEMORY DEVICE INCLUDING VARIABLE RESISTANCE ELEMENT OR PHASE-CHANGE ELEMENT

CROSS-REFERENCE TO RELATED APPLICATIONS

This application is based upon and claims the benefit of priority from Japanese Patent Application No. 2010-064735, filed Mar. 19, 2010; the entire contents of which are incorporated herein by reference.

FIELD

Embodiments described herein relate generally to a semiconductor memory device that uses a variable resistance element or a phase-change element as a memory element, and relate to, e.g., a resistance-change memory.

BACKGROUND

In recent years, as an electrically rewritable nonvolatile semiconductor memory device, a resistance-change memory such as a resistive RAM (ReRAM) that uses a variable resistance element as a memory element or a phase-change RAM (PCRAM) that uses a phase-change element as a memory element has been attracting attention as a successor to flash memory.

In the resistance-change memory, since a cell array can be configured by laminating, e.g., a variable resistance element and a rectification element such as a diode at each cross-point of a bit line and a word line, a three-dimensional laminated memory whose memory capacity can be heightened can be formed without increasing an area of a cell array portion.

The resistance-change memory finally has a configuration in which an oxide film is buried between many pillars in which the variable resistance element and the diode are laminated. The variable resistance element is constituted of a variable resistance material/an electrode such as an electrode/a metal oxide (two- or three-dimensional base).

However, in the above-described configuration, an impurity such as fluorine or hydrogen that diffuses into the variable resistance material from the oxide film. It becomes a buried material may possibly degrade characteristics of the variable resistance material. Therefore, a configuration that the diffusion of the impurity, e.g., fluorine or hydrogen is suppressed by covering a side surface of the variable resistance material with a silicon nitride film has been suggested (see, e.g., JP-A 2009-123900 [KOKAI]).

On the other hand, when a silicon nitride film is formed in such a manner that it is in contact with a side surface of a silicon diode as a rectification element, a reverse current increases to degrade rectification element characteristics.

BRIEF DESCRIPTION OF THE DRAWINGS

FIG. 2 is a perspective view showing a cross-point memory cell array in the embodiment;

FIG. 3 is a perspective view of cell units in two memory cell arrays in the embodiment;

FIGS. 4 and 5 are views each showing connection relationships between a memory element and a rectification element in the cell unit according to the embodiment;

FIGS. 6 and 7 are views each showing an example of a layout of first and second control circuits in the embodiment;

FIG. 8 is a view showing a second example of the layout of the first and second control circuits in the embodiment;

FIG. 9 is a perspective view of two memory cell arrays in the embodiment;

FIGS. 16 to 28 are cross-sectional views showing a manufacturing method of the cell unit in the embodiment;

FIG. 29A is a top view of a modification of the cell unit in the embodiment;

FIGS. 29B and 29C are cross-sectional views of the modification of the cell unit in the embodiment;

FIGS. 30 and 31 are cross-sectional views showing a manufacturing method of the second modification of the cell unit in the embodiment.

DETAILED DESCRIPTION

Figure 1:
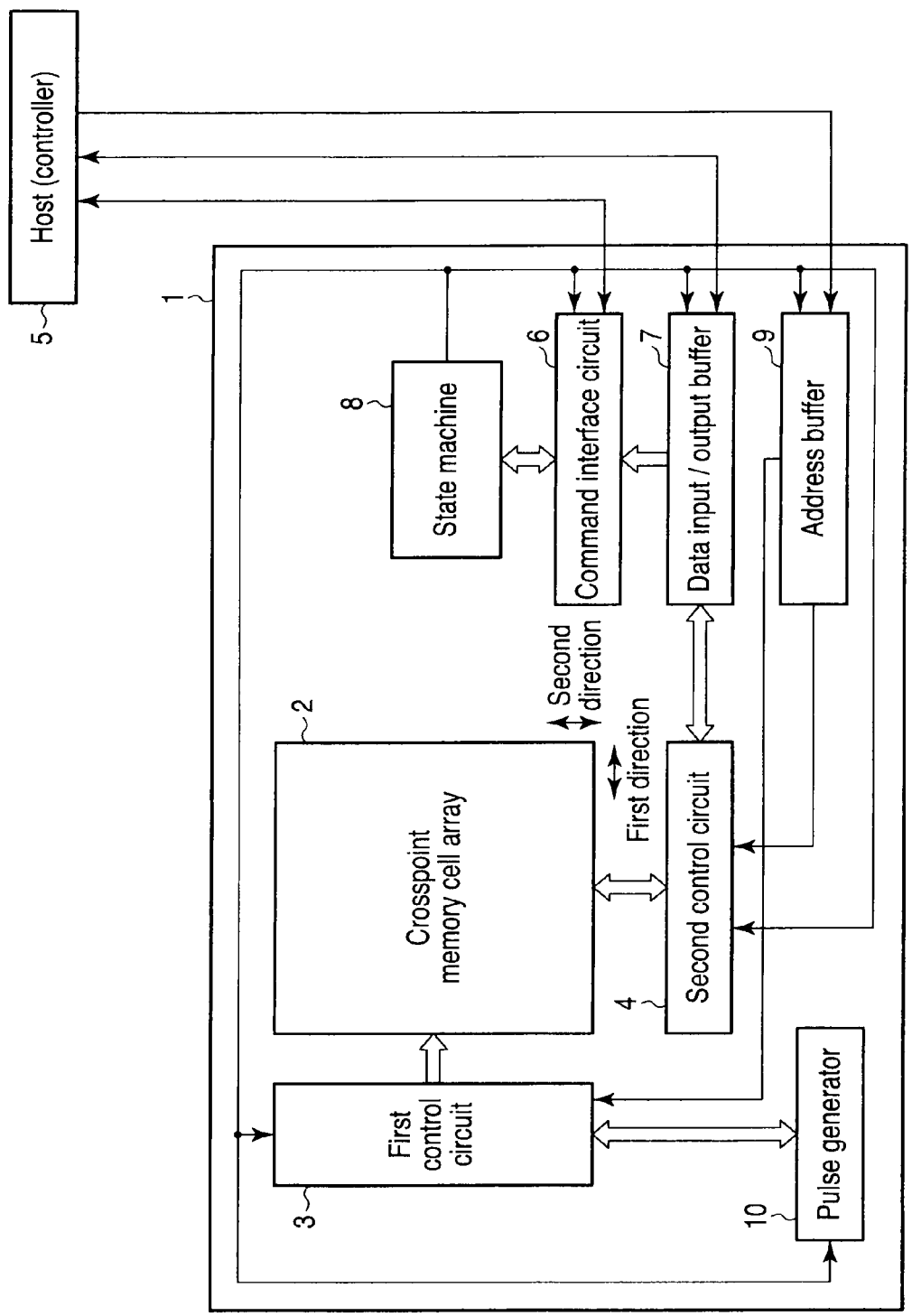
FIG. 1 is a block diagram showing a primary part of a resistance-change memory according to an embodiment.

A semiconductor memory device and a manufacturing method thereof according to an embodiment will now be described hereinafter with reference to the accompanying drawings. Here, a resistance-change memory will be taken as an example of the semiconductor memory device.

In general, according to one embodiment, a semiconductor memory device includes a first conductive line, a second conductive line, a cell unit, a silicon nitride film, and an insulating film. The first conductive line extends in a first direction. The second conductive line extends in a second direction crossing the first direction. The cell unit includes a phase-change film and a diode including a p-type semiconductor layer and an n-type semiconductor layer. The cell unit is connected in series between the first conductive line and the second conductive line. The silicon nitride film is formed on a side surface of the phase-change film. The insulating film is formed on a side surface of the diode and has a smaller amount of charge trapping than the silicon nitride film.

[1] Basic Configuration

The embodiments are intended for a semiconductor memory device that includes a resistance-change memory using a variable resistance element or a phase-change element as a memory element. Here, the variable resistance element means an element formed of a material whose resistance varies because of the influence of, e.g., voltage, current or heat, and the phase-change element means an element formed of a material whose physical properties such as resistance or capacitance vary because of a phase change.

The phase change (phase transition) includes the following:

A metal-semiconductor transition, a metal-insulator transition, a metal-metal transition, an insulator-insulator transition, an insulator-semiconductor transition, an insulator-metal transition, a semiconductor-semiconductor transition, a semiconductor-metal transition, a semiconductor-insulator transition;

A phase change of a quantum state (e.g., a metal-superconductor transition);

A paramagnetic material-ferromagnetic material transition, an antiferromagnetic material-ferromagnetic material transition, a ferromagnetic material-ferromagnetic material transition, a ferrimagnetic material-ferromagnetic material transition, transitions based on combinations of these transitions;

A paraelectric material-ferroelectric material transition, a paraelectric material-pyroelectric material transition, a paraelectric material-piezoelectric material transition, a ferroelectric material-ferroelectric material transition, an antiferroelectric material-ferroelectric material transition, transitions based on combinations of these transitions; and Transitions based on combinations of the above-described transitions.

For example, a transition from a metal, an insulator, a semiconductor, a ferroelectric material, a paraelectric material, a pyroelectric material, a piezoelectric material, a ferromagnetic material, a ferrimagnetic material, a helimagnetic material, a paramagnetic material, or an antiferromanetic material to a ferroelectric/ferromagnetic material, and a transition in the opposite direction.

According to this definition, the variable resistance element includes the phase-change element, but the variable resistance element means an element mainly formed of, e.g., a metal oxide, a metal compound, an organic thin film, carbon or carbon nanotubes in this specification.

Further, the embodiments are intended for a resistance-change memory such as a ReRAM using a variable resistance element as a memory element or a PCRAM using a phase-change element as a memory element. That is because, in each of these resistance-change memories, a memory cell array is of a cross-point type, a large memory capacity can be realized by three-dimensional integration, and a high-speed operation comparable to a DRAM can be performed.

In the cross-point memory cell array, to cause a current to flow to a selected memory element alone, the memory element and a rectification element are connected in series between a word line and a bit line.

Here, as a method of changing the resistance of the memory element, there are a method of reversibly changing the resistance of the memory element to/from at least a first value and a second value by changing the polarity of a voltage applied to the memory element and a method of reversibly changing the resistance of the memory element to/from at least a first value and a second value by controlling the magnitude and application time of a voltage applied to the memory element without changing the polarity of the voltage.

The former is called a bipolar operation, and the latter is called a unipolar operation.

The bipolar operation is adopted in a memory that requires a bidirectional current at the time of a write operation in, e.g., a magnetic random access memory. Furthermore, the resistance-change memory according to the embodiments can be configured to perform the bipolar operation.

It is to be noted that the resistance-change memory according to the embodiment will be described based on the unipolar operation of reversibly changing the resistance of the memory element to/from at least a first value and a second value by controlling the magnitude and application time of a voltage applied to the memory element without changing the polarity of the voltage.

When configuring the resistance-change memory having a cross-point memory cell array (which will be referred to as a cross-point resistance-change memory hereinafter) to perform the unipolar operation, a rectification element must have characteristics wherein current is large at the time of application of a forward bias, and current is small and breakdown voltage is large at the time of application of a reverse bias, in order to accurately effect a set/reset operation and a read operation.

Meanwhile, in the resistance-change memory is formed a configuration that a cell unit constituted of a memory element and a rectification element is arranged at each cross-point of a bit line and a word line and an interlayer insulating film such as an oxide film is buried between the plurality of cell units.

Such a configuration has a possibility that an impurity such as fluorine or hydrogen diffuses into the memory element from the oxide film buried between the cell units to degrade characteristics of the memory element.

Thus, in the embodiment, the diffusion of the impurity, e.g., fluorine or hydrogen into the memory element is avoided by forming a silicon nitride film on a side surface of the memory element.

On the other hand, when the silicon nitride film is formed on a side surface of a diode as the rectification element, a reverse current increases in the rectification element to degrade rectification element characteristics.

Thus, moreover, in the embodiment, the increase in reverse current in the rectification element is suppressed by forming a silicon oxide film on the side surface of the rectification element.

Based on the above-described configurations, a resistance-change memory that can exercise performance as a cell unit including a memory element and a rectification element to the full extent is provided.

[2] Embodiment

[2-1] Overall View

FIG. 1 is a block diagram showing a primary part of a resistance-change memory according to the embodiment.

A resistance-change memory (e.g., a chip) 1 has a cross-point memory cell array 2. The cross-point memory cell array 2 is formed of a laminated structure of a plurality of memory cell arrays.

A first control circuit 3 is arranged at on end of the cross-point memory cell array 2 in a first direction, and a second control circuit 4 is arranged at one end in a second direction crossing the first direction.

Each of the first and second control circuits 3 and 4 selects one of the plurality of laminated memory cell arrays based on, e.g., a memory cell array selection signal.

The first control circuit 3 selects a row in the cross-point memory cell array 2 based on a row address signal, for example. Additionally, the second control circuit 4 selects a column in the cross-point memory cell array 2 based on a column address signal, for example.

The first and second control circuits 3 and 4 control writing/erasing/reading data with respect to memory elements in the cross-point memory cell array 2.

The first and second control circuits 3 and 4 can write/erase/read data with respect to one of the plurality of laminated memory cell arrays or write/erase/read data with respect to two or more of the plurality of laminated memory cell arrays at the same time.

Here, in the resistance-change memory 1, writing is called setting and erasing is called resetting. It is sufficient for the set resistance to be different from the reset resistance, and whether the set resistance is higher or lower than the reset resistance is not important.

Further, when one of a plurality of resistances can be selectively written in a set operation, a multi-level resistance-change memory in which one memory element stores multi-level data can be realized.

A controller 5 supplies a control signal and data to the resistance-change memory 1. The control signal is input to a command interface circuit 6, and the data is input to a data input/output buffer 7. Furthermore, the controller 5 may be arranged in the chip 1, or it may be arranged in a host (computer) different from the chip 1.

The command interface circuit 6 judges whether data from a host 5 is command data based on the control signal, and transfers the data from the data input/output buffer 7 to a state machine 8 if the data is the command data.

The state machine 8 manages operations of the resistance-change memory 1 based on the command data. For example, the state machine 8 manages a set/reset operation and a read operation based on the command data from the host 5.

The controller 5 can receive status information managed by the state machine 8 and judge an operation result in the resistance-change memory 1.

In the reset/reset operation and the read operation, the controller 5 supplies an address signal to the resistance-change memory 1. The address signal includes, e.g., a memory cell array selection signal, a row address signal and a column address signal.

The address signal is input to the first and second control circuits 3 and 4 via an address buffer 9.

A pulse generator 10 outputs a voltage pulse or a current pulse required for the set/reset operation and the read operation at a predetermined timing based on a command from the state machine 8.

[2-2] Memory Cell Array

FIG. 2 is a perspective view of the cross-point memory cell array in the embodiment.

The cross-point memory cell array 2 is arranged on a semiconductor substrate (e.g., a silicon substrate) 11. It is to be noted that a circuit element such as a MOS transistor or an insulating film may be sandwiched between the cross-point memory cell array 2 and the semiconductor substrate 11.

FIG. 2 shows a configuration that the cross-point memory cell array 2 is formed of four memory cell arrays M1, M2, M3 and M4 laminated in a third direction (direction vertical to a main plane of the semiconductor substrate 11) as an example, but it is sufficient for the number of laminated memory cell arrays to be two or more.

Memory cell array M1 is formed of a plurality of cell units CU1 arranged in an array in first and second directions.

Likewise, memory cell array M2 is formed of a plurality of cell units CU2 arranged in an array, memory cell array M3 is formed of a plurality of cell units CU3 arranged in an array, and memory cell array M4 is formed of a plurality of cell units CU4 arranged in an array.

Each of cell units CU1, CU2, CU3 and CU4 is formed of a memory element and a rectification element (non-ohmic element) which are connected in series.

Furthermore, on the semiconductor substrate 11 are arranged conductive lines L1(j−1), L1(j) and L1(j+1), conductive lines L2(i−1), L2(i) and L2(i+1), conductive lines L3(j−1), L3(j) and L3(j+1), conductive lines L4(i−1), L4(i) and L4(i+1), and conductive lines L5(j−1), L5(j) and L5(j+1) in order from the semiconductor substrate 11 side.

The odd-numbered conductive lines, i.e., conductive lines L1(j−1), L1(j) and L1(j+1), conductive lines L3(j−1), L3(j) and L3(j+1), and conductive lines L5(j−1), L5(j) and L5(j+1) extend in the second direction from the semiconductor substrate 11 side.

The even-numbered conductive lines, i.e., conductive lines L2(i−1), L2(i) and L2(i+1) and conductive lines L4(i−1), L4(i) and L4(i+1) extend in the first direction from the semiconductor substrate 11 side.

These conductive lines function as word lines or bit lines.

The lowermost first memory cell array M1 is arranged between the first conductive lines L1(j−1), L1(j) and L1(j+1) and the second conductive lines L2(i−1), L2(i) and L2(i+1). In the set/reset operation and the read operation for memory cell array M1, either conductive lines L1(j−1), L1(j) and L1(j+1) or conductive lines L2(i−1), L2(i) and L2(i+1) function as word lines, and the remaining conductive lines function as bit lines.

Memory cell array M2 is arranged between the second conductive lines L2(i−1), L2(i) and L2(i+1) and the third conductive lines L3(j−1), L3(j) and L3(j+1). In the set/reset operation and the read operation for memory cell array M2, either conductive lines L2(i−1), L2(i) and L2(i+1) or conductive lines L3(j−1), L3(j) and L3(j+1) function as word lines, and the remaining conductive lines function as bit lines.

Memory cell array M3 is arranged between the third conductive lines L3(j−1), L3(j) and L3(j+1) and the fourth conductive lines L4(i−1), L4(i) and L4(i+1). In the set/reset operation and the read operation for memory cell array M3, either conductive lines L3(j−1), L3(j) and L3(j+1) or conductive lines L4(i−1) L4(i) and L4(i+1) function as word lines, and the remaining conductive lines function as bit lines.

Memory cell array M4 is arranged between the fourth conductive lines L4(i−1), L4(i) and L4(i+1) and the fifth conductive lines L5(j−1), L5(j) and L5(j+1). In the set/reset operation and the read operation for memory cell array M4, either conductive lines L4(i−1), L4(i) and L4(i+1) function as word lines, and the remaining conductive lines function as bit lines.

[2-3] Cell Unit

Figures 3, 4:
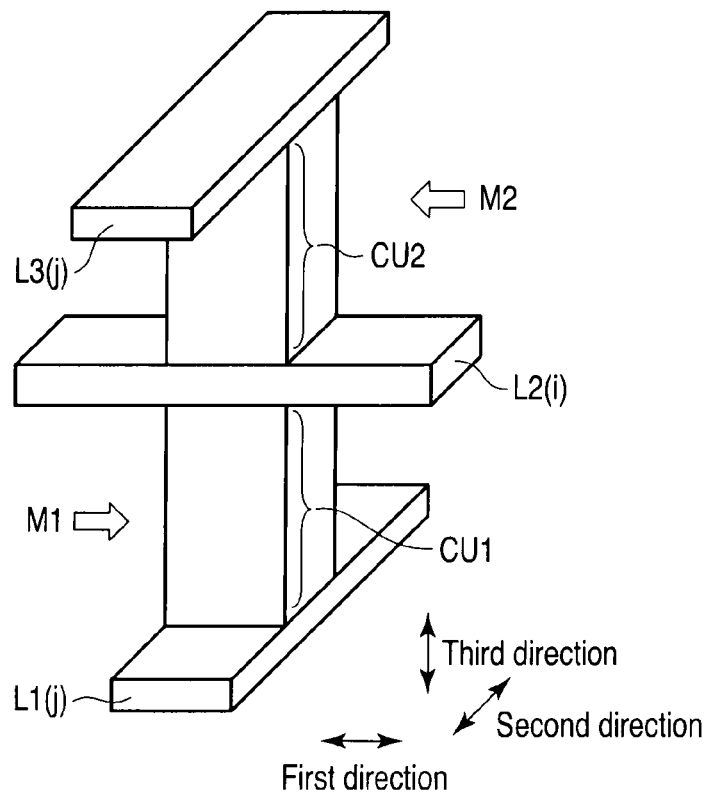

FIG. 3 is a perspective view of cell units in two memory cell arrays in the embodiment.

Here, for example, cell units CU1 and CU2 in the two memory cell arrays M1 and M2 in FIG. 2 are shown. In this case, configurations of cell units in the two memory cell arrays M3 and M4 in FIG. 2 are equal to configurations of the cell units in the two memory cell arrays M1 and M2 in FIG. 2.

Each of cell units CU1 and CU2 is formed of a memory element and a rectification element connected in series.

As connection relationships between the memory element and the rectification element, there are various patterns.

However, all cell units in one memory cell array must have the same connection relationship between the memory element and the rectification element.

FIGS. 4 and 5 show connection relationships between the memory element and the rectification element in the embodiment.

In one cell unit, there are a total of four patters as connection relationships between the memory element and the rectification element side since there are two positional relationships between the memory element and the rectification element and two directions of the rectification element. Therefore, in regard to the cell units in the two memory cell arrays, there are 16 patterns (4 patterns×4 patterns) as connection relationships between the memory element and the rectification element.

Reference characters a to p in FIGS. 4 and 5 denote the 16 patters as the connection relationships.

In cell units CU1 and CU2, the lower side corresponds to the semiconductor substrate side in the drawings.

Although the embodiment can be applied to all the 16 patterns as the connection relationships, the connection relationship denoted by a will be mainly taken as an example in the following description.

[2-4] Layout of First and Second Control Circuits

Each of FIGS. 6 and 7 shows a first example of a layout of the first and second control circuits in the embodiment.

A memory cell array Ms corresponding to one of memory cell arrays M1, M2, M3 and M4 depicted in FIG. 2 is formed of a plurality of cell units CUs arranged in the array as shown in FIG. 6. One end of each cell unit CUs is connected to a conductive line Ls(j−1), Ls(j) or Ls(j+1), and the other end of the same is connected to a conductive line Ls+1(i−1), Ls+1(i) or Ls+1(i+1).

As shown in FIG. 7, a memory cell array Ms+1 is formed of a plurality of cell units CUs+1 arranged in an array. One end of each cell unit CUs+1 is connected with a conductive line Ls+1(i−1), Ls+1(i) or Ls+1(i+1), and the other end of the same is connected with a conductive line Ls+2(j−1), Ls+2(j) or Ls+2(j+1).

However, s is 1, 3, 5, 7, . . . .

The first control circuit 3 is connected with one end of each of conductive lines Ls+1(i−1), Ls+1(i) and Ls+1(i+1) in the first direction via a switch element SW1. Switch circuit SW1 is formed of, e.g., an N-channel FET (field effect transistor) controlled by a control signal φs+1(i−1), φs+1(i) or φs+1(i+1).

The second control circuit 4 is connected with one end of each of conductive lines Ls(j−1), Ls(j) and Ls(j+1) in the second direction via a switch element SW2. Switch circuit SW2 is formed of, e.g., an N-channel FET controlled by a control signal φs(j−1), φs(j) or φs(j+1).

The second control circuit 4 is connected with one end of each of conductive lines Ls+2(j−1), Ls+2(j) and φs+2(j+1) in the second direction via a switch element SW2. Switch circuit SW2 is formed of an N-channel FET controlled by a control signal φs+2(j−1), φs+2(j) or φs+2(j+1).

FIG. 8 shows a second example of a layout of the first and second control circuits in the embodiment.

The layout in the second example is different from the layout in the first example is that the first control circuits 3 are arranged at both ends of each of memory cell arrays Ms, Ms+1, Ms+2 and Ms+3 in the first direction and the second control circuits 4 are arranged at both ends of each of memory cell arrays Ms, Ms+1, Ms+2 and Ms+3 in the second direction.

However, s is 1, 5, 9, 13, . . . .

The first control circuits 3 are connected to both ends of each of conductive lines Ls+1(i−1), Ls+1(i) and Ls+1(i+1) in the first direction through switch elements SW1. Switch circuit SW1 is formed of, e.g., an N-channel FET controlled by a control signal φs+1(i−1), φs+1(i), φs+1(i+1), φs+3(i−1), φs+3(i) or φs+3(i+1).

The second control circuits 4 are connected to both ends of each of conductive lines Ls(j−1), Ls(j) and Ls(j+1) in the second direction via switch elements SW2. Switch circuit SW2 is formed of, e.g., an N-channel FET controlled by a control signal φs(j−1), φs(j), φs(j+1), φs+2(j−1), φs+2(j) or φs+2(j+1).

[2-5] Operations

Operations of the resistance-change memory will now be described.

FIG. 9 is a perspective view of two memory cell arrays in the embodiment.

A memory cell array M1 corresponds to memory cell array M1 in FIG. 2, and a memory cell array M2 corresponds to memory cell array M2 in FIG. 2.

A connection relationship between a memory element and a rectification element in each of cell units CU1 and CU2 corresponds to a in FIG. 4.

A. Set Operation

An example of performing a write (set) operation with respect to a selected cell unit CU1-sel in memory cell array M1 will now be described.

An initial state of selected cell unit CU1-sel is an erased (reset) state.

Further, the reset state is determined as a high-resistance state (100 kΩ to 1 MΩ), and the set state is determined as a low-resistance state (1 to 10 kΩ).

A selected conductive line L2(i) is connected to a power supply potential Vdd on a high-potential side, and a selected conductive line L1(j) is connected to a power supply potential Vss on a low-potential side.

Furthermore, non-selected conductive lines L1(j−1) and L1(j+1) other than selected conductive line L1(j) in first conductive lines from a semiconductor substrate side are connected to the power supply potential Vdd. A non-selected conductive line L2(i+1) other than selected conductive line L2(i) in second conductive lines from the semiconductor substrate side is connected to the power supply potential Vss.

Moreover, third non-selected conductive lines L3(j−1), L3(j) and L3(j+1) from the semiconductor substrate side are connected to the power supply potential Vss.

At this time, since a forward bias is applied to a rectification element (diode) in selected cell unit CU1-sel, a set current I-set from a constant current source flows through selected cell unit CU1-sel, whereby the resistance of a memory element in the selected cell unit varies from the high-resistance state to the low-resistance state.

Here, at the time of the set operation, a voltage of 1 to 2 V is applied to the memory element in selected cell unit CU1-sel, and the current density of the set current I-set that is to flow through the memory element (high-resistance state) is set within the range of $1 \times 10^5$ to $1 \times 10^7$ A/cm$^2$.

On the other hand, a reverse bias is applied to a rectification element (diode) in each cell unit connected between non-selected conductive line L1(j−1) or L1(j+1) and non-selected conductive line L2(i+1) in non-selected cell units CU1-unsel in the memory cell array.

Likewise, a reverse bias is applied to a rectification element (diode) in each cell unit connected between non-selected conductive line L2(i) and non-selected conductive line L3(j−1), L3(j) or L3(j+1) in non-selected cell units CU2-unsel in memory cell array M2.

Therefore, the rectification element in each cell unit must have characteristics wherein current is sufficiently small and breakdown voltage is sufficiently large when the reverse bias is applied.

B. Reset Operation

An example of performing an erase (reset) operation with respect to a selected cell unit CU1-sel in memory cell array M1 will now be described.

A selected conductive line L2(i) is connected to the power supply potential Vdd on the high-potential side, and a selected conductive line L1(j) is connected to the power supply potential Vss on the low-potential side.

Moreover, remaining non-selected conductive lines L1(j−1) and L1(j+1) other than selected conductive line L1(j) in the first conductive lines from the semiconductor substrate side are connected to the power supply potential Vdd. A remaining non-selected conductive line L2(i+1) other than selected conductive line L2(i) in second conductive lines from the semiconductor substrate side is connected to the power supply potential Vss.

Additionally, third non-selected conductive lines L3(j−1), L3(j) and L3(j+1) from the semiconductor substrate side are connected to the power supply potential Vss.

At this time, since a forward bias is applied to the rectification element (diode) in selected cell unit CU1-sel, a reset current I-reset flows through selected cell unit CU1-sel from the constant current source, whereby the resistance of the memory element in selected cell unit CU1-sel varies from the low-resistance state to the high-resistance state.

Here, at the time of the reset operation, a voltage of 1 to 3 V is applied to the memory element in selected cell unit CU1-sel, and the current density of the reset current I-reset that is to flow through the memory element (low-resistance state) is set within the range of $1 \times 10^3$ to $1 \times 10^6$ A/cm$^2$.

On the other hand, a reverse bias is applied to the rectification element (diode) in each cell unit connected between non-selected conductive line L1(j−1) or L1(j+1) and non-selected conductive line L2(i+1) in non-selected cell unit CU1-unsel in memory cell array M1.

Likewise, a reverse bias is applied to the rectification element (diode) in each cell unit connected between non-selected conductive line L2(i) and non-selected conductive line L3(j−1), L3(j) or L3(j+1) in non-selected cell unit CU2-unsel in memory cell array M2.

Therefore, the rectification element (diode) in each cell unit must have characteristics wherein current is sufficiently small and breakdown voltage is sufficiently large when the reverse bias is applied.

It is to be noted that the set current I-set is different from the reset current I-reset. Additionally, the voltage applied to the memory element in selected cell unit CU1-sel to generate these currents is dependent on the material forming the memory element.

C. Read Operation

An example of performing a read operation with respect to a selected cell unit CU1-sel in memory cell array M1 will now be described.

A selected conductive line L2(i) is connected to the power supply potential Vdd on the high-potential side, and a selected conductive line L1(j) is connected to the power supply potential Vss on the low-potential side.

Further, remaining non-selected conductive lines L1(j−1) and L1(j+1) other than selected conductive line L1(j) in first conductive lines from the semiconductor substrate side are connected to the power supply potential Vdd. A remaining non-selected conductive line L2(i+1) other than selected conductive line L2(i) in second conductive lines from the semiconductor substrate side is connected to the power supply potential Vss.

Furthermore, third non-selected conductive lines L3(j−1), L3(j) and L3(j+1) from the semiconductor substrate side are connected to the power supply potential Vss.

At this time, since a forward bias is applied to the rectification element (diode) in selected cell unit CU1-sel, a read current I-read from the constant current source flows through the memory element (high-resistance state or the low-resistance state) in selected cell unit CU1-sel.

Therefore, for example, detecting a change in potential at a sense node when the read current I-read is flowing through the memory element enables the reading of data (resistance) in this memory element.

Here, the read current I-read must be sufficiently smaller than the set current I-set and the reset current I-reset so that the resistance of the memory element does not change at the time of reading.

At the time of the read operation, like the set/reset operation, a reverse bias is applied to the rectification element (diode) in each cell unit connected between non-selected conductive line L1(j−1) or L1(j+1) and non-selected conductive line L2(i+1) in non-selected cell unit CU1-unsel in memory cell array M1.

Moreover, a reverse bias is also applied to the rectification element (diode) in each cell unit connected between non-selected conductive line L2(i) and non-selected conductive line L3(j−1), L3(j) or L3(j+1) in non-selected cell unit CU2-unsel in memory cell array M2.

Therefore, the rectification element in each cell unit must have characteristics wherein current is sufficiently small and breakdown voltage is sufficiently large when the reverse bias is applied.

[2-6] Memory Element and Rectification Element

The cell unit (memory element and rectification element) utilized in the resistance-change memory according to the embodiment will now be described in detail. As a connection relationship between the memory element and the rectification element in the cell unit, a in FIG. 4 will be taken as an example.

Figure 10:
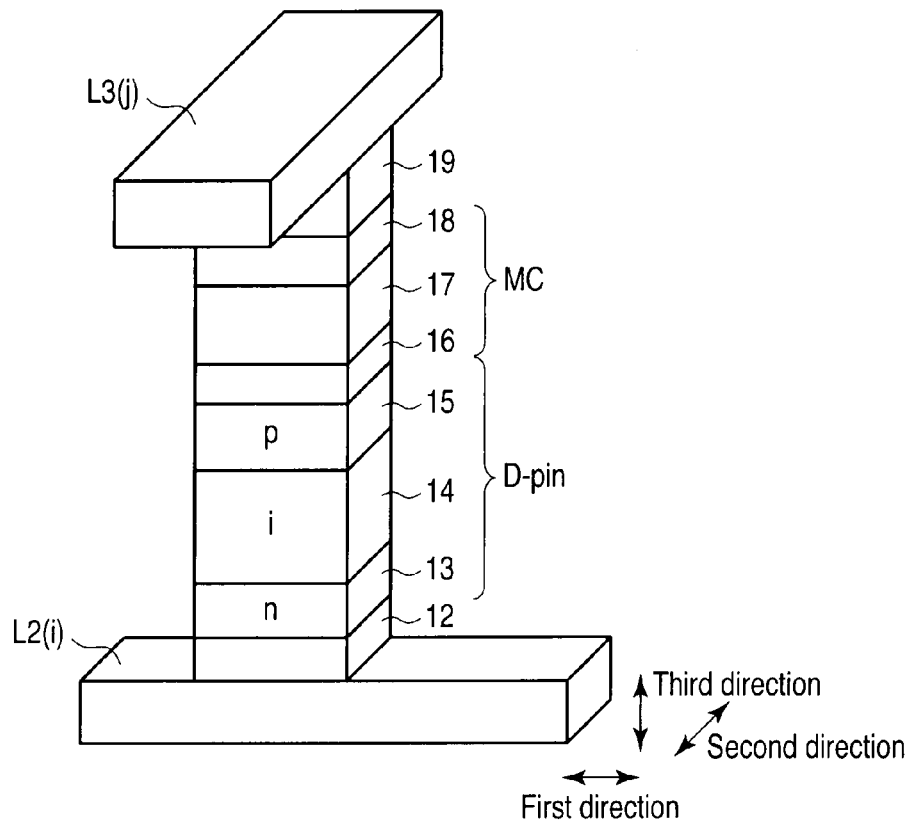
FIG. 10 is a perspective view showing a configuration of one cell unit in the embodiment.

FIG. 10 is a perspective view showing a configuration of one cell unit in the embodiment.

On conductive line L2(i) extending in the first direction are sequentially laminated an electrode layer 12, an n-type semiconductor layer 13, an intrinsic semiconductor layer 14, a p-type semiconductor layer 15 and an electrode layer 16.

The intrinsic semiconductor layer 14 is a semiconductor layer having no impurity doped therein or a semiconductor layer containing a very small amount of an impurity that can be ignored with respect to an intrinsic carrier density. That is, the intrinsic semiconductor layer is defined as a semiconductor in which a conduction electron density is equal to a hole density which is ideally a semiconductor containing no impurity, but a semiconductor layer is treated as an intrinsic semiconductor layer when its impurity concentration seems to be far lower than the intrinsic carrier density even though a very small amount of a p- or n-type impurity is included.

A silicon p-i-n diode D-pin as the rectification element is formed of the n-type semiconductor layer 13, the intrinsic semiconductor layer 14 and the p-type semiconductor layer 15.

A memory element 17 formed of a variable resistance element or a phase-change element and an electrode layer 18 are sequentially laminated on the electrode layer 16. A memory cell MC as a memory element includes the electrode layer 16, the memory element 17 and the electrode layer 18.

Moreover, a mask material 19 is arranged on the electrode layer 18, and conductive line L3(j) extending in the second direction crossing the first direction is arranged on the mask material 19. The mask material 19 is utilized as a mask in a process of forming these layers 12 to 18, and it may not be formed in some cases.

A. Comparative Example

The plurality of cell units depicted in FIG. 10 are arranged on a substrate, and a configuration that an interlayer insulating film, e.g., a silicon oxide film is buried between the cell units is formed. Such a configuration has a possibility that an impurity such as fluorine or hydrogen diffuses into the memory element 17 from the silicon oxide film. It becomes to degrade characteristics of the memory element 17.

Therefore, a configuration that the diffusion of the impurity, e.g., fluorine or hydrogen into the memory element 17 is avoided by covering a side surface of the memory element 17 with a silicon nitride film is utilized.

Figure 11:
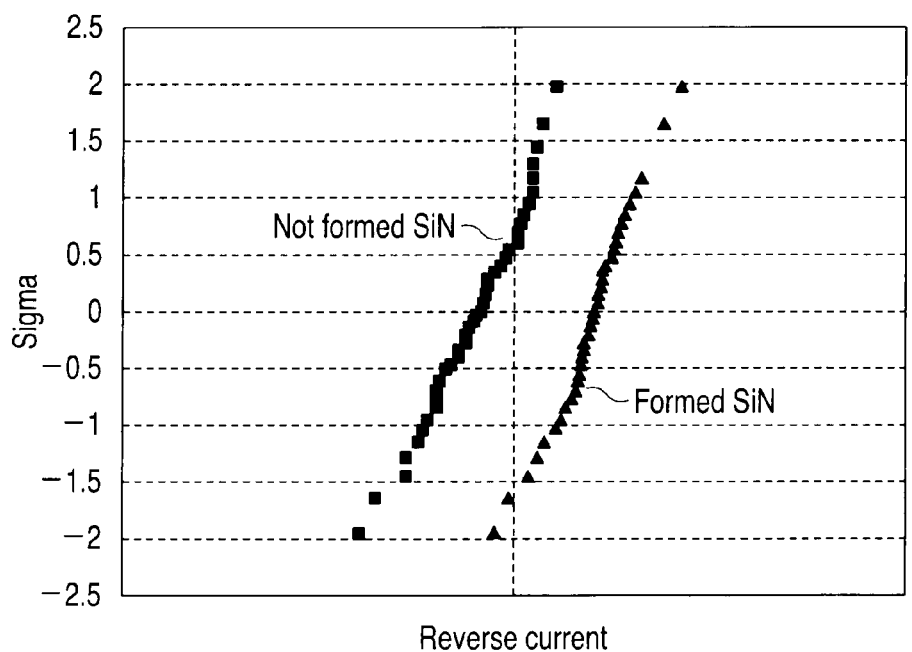
FIG. 11 is a view showing a change in reverse current depending on presence/absence of a silicon nitride film in a comparative example.

However, when the silicon nitride film is formed to come into contact with a side surface of the rectification element, i.e., the p-i-n diode D-pin (n-type semiconductor layer 13, intrinsic semiconductor layer 14 and p-type semiconductor layer 15), a reverse current increases. It becomes to degrade rectification characteristics of the rectification element. FIG. 11 shows a change in reverse current depending on presence/absence of the silicon nitride film on the side surface of the rectification element. The ordinate in FIG. 11 represents variance of data, and the abscissa represents current on a logarithmic scale. Here, it can be understood that, when the silicon nitride film is formed to come into contact with the side surface of the rectification element, the reverse current increases as compared with a case that the silicon nitride film is not formed on the side surface of the rectification element. That is, the reverse current increases through a defect on an interface between the semiconductor layer and the silicon nitride film of the rectification element.

B. Embodiment

In the embodiment, a silicon nitride film is formed on a side surface of the memory element 17 alone, and the silicon nitride film is not formed to come into contact with the side surface of the rectification element. As a result, the impurity, e.g., fluorine or hydrogen is prevented from diffusing into the memory element 17, and the reverse current in the rectification element is suppressed from increasing.

A configuration of a cell unit according to the embodiment will now be described in detail.

Figure 12:
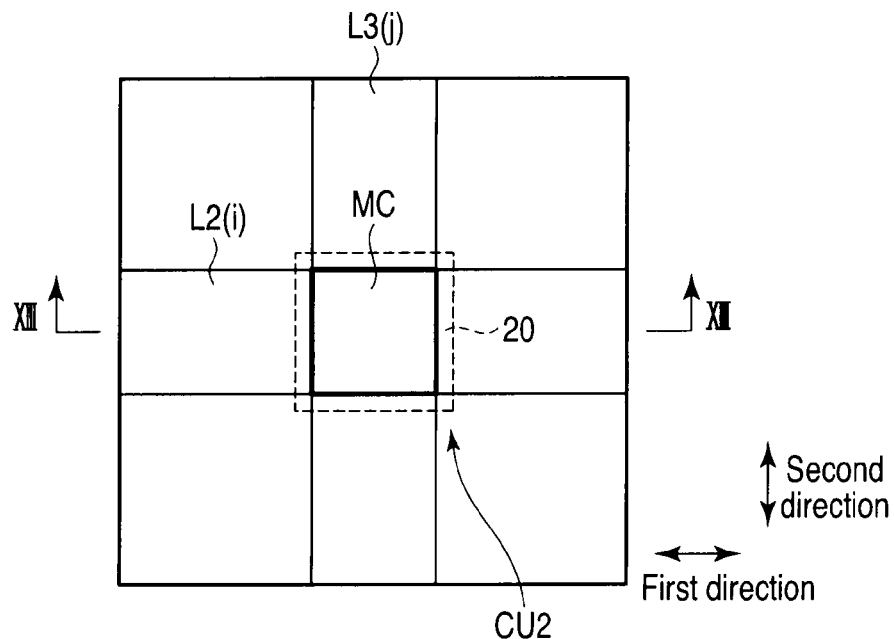
FIG. 12 is a top view of a cell unit in the embodiment.
Figure 13A:
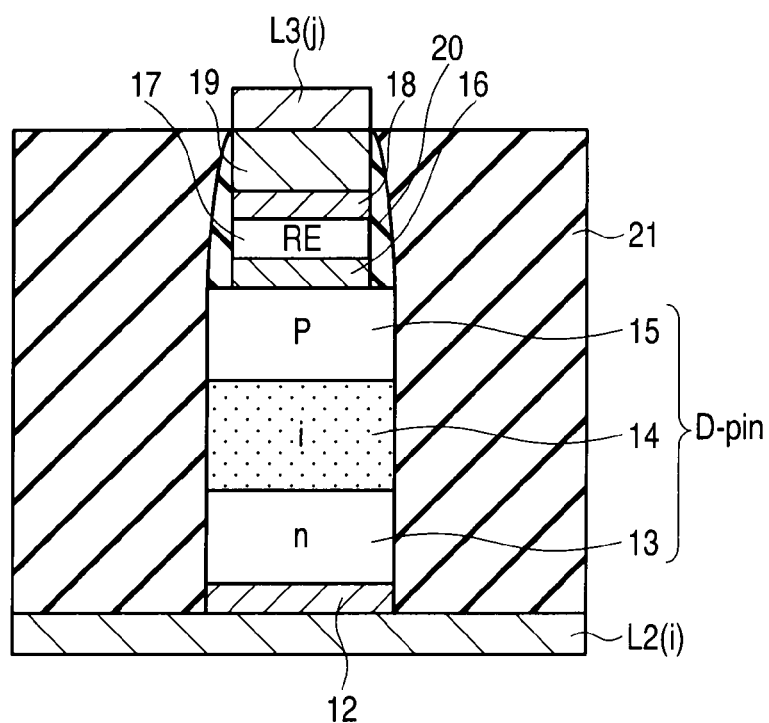
FIG. 13A is a cross-sectional view of a cell unit in the embodiment.

FIG. 12 is a view showing a cell unit formed of a memory element and a rectification element in the embodiment from a top face thereof. FIG. 13A is a cross-sectional view of the cell unit taken along line XIII-XIII in FIG. 12. As shown in FIG. 12, a cell unit CU2 is arranged at an intersection of a conductive line L2(i) and a conductive layer L3(j). Here, a silicon nitride film 20 is disposed to surround cell unit CU2. To be more accurate, the silicon nitride film 20 is disposed to surround a memory cell MC of cell unit CU2.

As shown in FIG. 13A, an electrode layer 12, an n-type semiconductor layer 13, an intrinsic semiconductor layer 14 and a p-type semiconductor layer 15 are sequentially laminated on conductive line L2(i) extending in the first direction. A silicon p-i-n diode D-pin as the rectification element is formed of the n-type semiconductor layer 13, the intrinsic semiconductor layer 14 and the p-type semiconductor layer 15.

A concentration of an n-type impurity contained in the n-type semiconductor layer 13 is set to $1\times10^{20}$ atoms/cm$^3$ or greater. Additionally, a concentration of a p-type impurity contained in the p-type semiconductor layer 15 is set to $1\times10^{20}$ atoms/cm$^3$ or greater. A leakage current at the time of applying a reverse bias can be reduced while earning a forward current by setting a concentration of the impurity to $1\times10^{20}$ atoms/cm$^3$ or greater.

Further, the n-type semiconductor layer 13 has a film thickness of 20 nm or less, the intrinsic semiconductor layer 14 has a film thickness of 60 to 120 nm or greater, and the p-type semiconductor layer 15 has a film thickness of 20 nm or less.

An electrode layer 16, a memory element (RE) 17 formed of a variable resistance element or a phase-change element and an electrode layer 18 are sequentially laminated on the p-type semiconductor layer 15. Furthermore, a mask material 19 is arranged on the electrode layer 18, and conductive line L3(j) extending in the second direction crossing the first direction is arranged on the mask material 19.

A silicon nitride film 20 as a sidewall film is disposed on a side surface of the memory element 17, side surfaces of the electrode layers 16 and 18 and a side surface of the mask material 19. A bottom face of the silicon nitride film 20 is in contact with a top face of the p-type semiconductor layer 15. A film thickness of the silicon nitride film 20 is 10 nm or less.

It is to be noted that the silicon nitride film 20 is not formed to come into contact with a side surface of the diode, i.e., side surfaces of the n-type semiconductor layer 13, the intrinsic semiconductor layer 14 and the p-type semiconductor layer 15 as shown in FIG. 13A.

In other words, the silicon nitride film 20 is formed to cover the side surfaces of the electrode layer 16, the memory element 17, the electrode layer 18 and the mask material 19. The silicon nitride film 20 is disposed on the p-type semiconductor layer 15, and a bottom face of the silicon nitride film 20 is in contact with the top face of the diode, i.e., the top face of the p-type semiconductor layer 15. Here, if the bottom face of the silicon nitride film 20 is level with or lower than at least a bottom face of the memory element 17, an impurity, e.g., fluorine or hydrogen can be prevented from diffusing into the memory element 17 from a coating-type insulating film 21.

Further, the side surfaces of the n-type semiconductor layer 13, the intrinsic semiconductor layer 14 and the p-type semiconductor layer 15 are formed in a self-aligned manner with respect to the side surface of the silicon nitride film 20. Therefore, the side surfaces of the n-type semiconductor layer 13, the intrinsic semiconductor layer 14 and the p-type semiconductor layer 15 substantially match with the side surface of the silicon nitride film 20.

When the memory element 17 and the diode are cut along a plane parallel to the first direction and the second direction, i.e., a plane parallel to a film surface of the memory element 17, a cross-sectional area of the memory element 17 is smaller than a cross-sectional area of the diode.

Furthermore, when a boundary between the memory element 17 and the silicon nitride film 20 on the side surface of the memory element and the diode D-pin is cut along a plane parallel to the first direction and the second direction, a cross-sectional area of the memory element 17 and the silicon nitride film 20 is substantially equal to a cross-sectional area of the diode D-pin. That is because the side surfaces of the n-type semiconductor layer 13, the intrinsic semiconductor layer 14 and the p-type semiconductor layer 15 are formed in a self-aligned manner with respect to the side surface of the silicon nitride film (sidewall film) 20 on the side surface of the memory element 17 as described above.

An interlayer insulating film, e.g., the coating-type insulating film 21 is disposed around the cell unit, i.e., on the side surface of the silicon nitride film 20 and the side surface of the diode. The coating-type insulating film 21 separates the plurality of arranged cell units from each other. The coating-type insulating film 21 consists of a silicon oxide insulating film, e.g., polysilazane formed by coating.

In the cell unit having the configuration depicted in FIG. 13A, since the silicon nitride film 20 is formed on the side surface of the memory element 17, the impurity, e.g., fluorine or hydrogen can be prevented from diffusing into the memory element 17 from the coating-type insulating film 21.

Figure 13B:
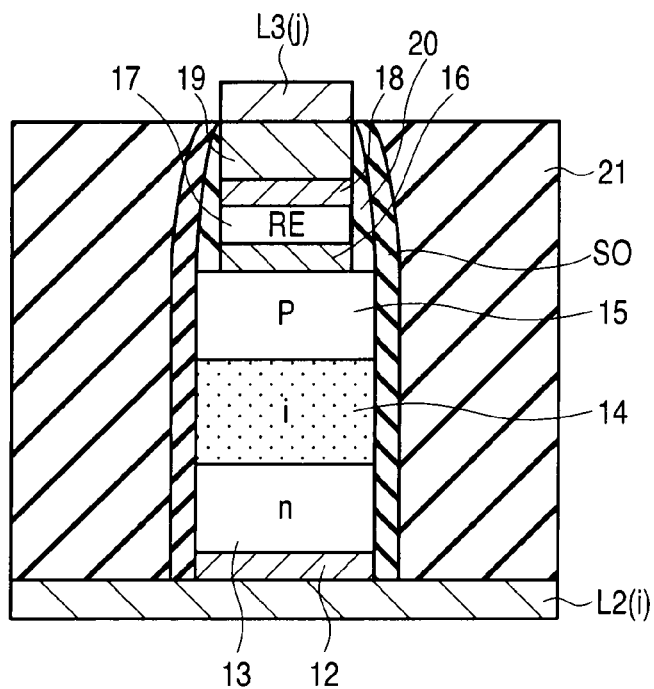
FIG. 13B is a cross-sectional view of a first modification of the cell unit in the embodiment.

On the other hand, since the silicon nitride film 20 is not formed on the side surface of the rectification element (p-i-n diode), an increase in reverse current that occurs when the silicon nitride film is directly formed on the side surface of the rectification element can be suppressed. It is preferable for the side surface of the rectification element to be covered with an insulating film that has a smaller amount of charge trapping than the silicon nitride film 20, e.g., a silicon oxide insulating film. Further, when using a material having a large amount of charge trapping for the coating-type insulating film 21, the effect can be obtained by forming a silicon oxide film SO having a small amount of charge trapping to come into contact with the side surface of the rectification element between the coating-type insulating film 21 and the rectification element as shown in FIG. 13B.

With the above-described structure, the performance as the cell unit can be exercised to the full extent.

Figure 14A:
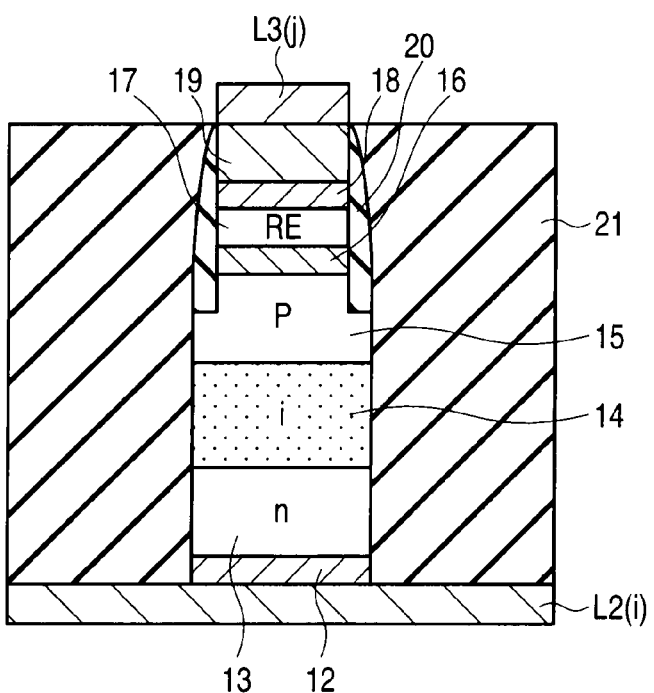
FIG. 14A is a cross-sectional view of a second modification of the cell unit in the embodiment.

Furthermore, FIG. 14A shows a modification of the embodiment.

FIG. 14A shows a case that a bottom face of the silicon nitride film 20 as the sidewall film of the memory element 17 is formed to be lower than the top face of the diode. That is, this drawing shows a case that the bottom face of the silicon nitride film 20 formed on the side surface of the memory element 17 intrudes into the p-type semiconductor layer 15 from the top face thereof. Here, the bottom face of the silicon nitride film 20 is lower than the top face of the p-type semiconductor layer 15 and higher than the lower surface of the p-type semiconductor layer 15.

The modification depicted in FIG. 14A has the same effect as that of the embodiment shown in FIG. 13A. Furthermore, in this modification, since an area of the silicon nitride film 20 that covers the cell unit CU increases, the impurity, e.g., fluorine or hydrogen can be effectively prevented from diffusing into the memory element 17 from the coating-type insulating film 21.

Figure 14B:
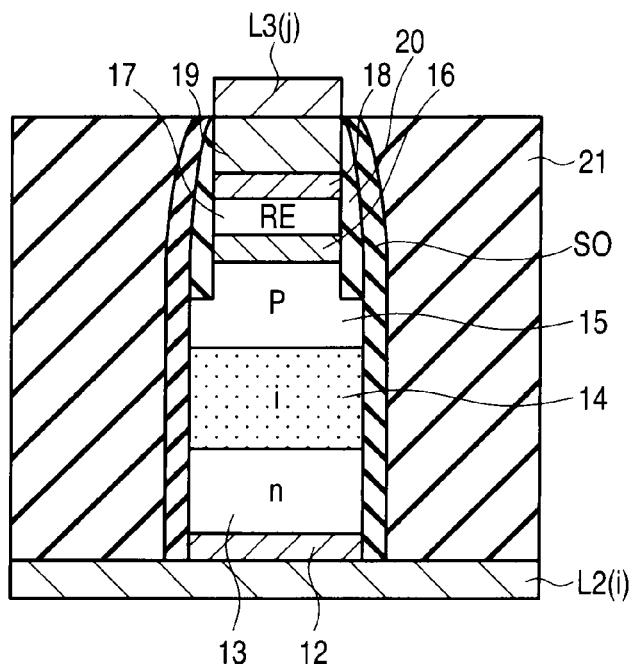
FIG. 14B is a cross-sectional view of a third modification of the cell unit in the embodiment.

Moreover, as shown in FIG. 14B, like FIG. 13B, the silicon oxide film SO can be formed between a fabric-type oxide film 21 and the rectification element to come into contact with the side surface of the rectification element.

[2-7] Manufacturing Method of Cell Unit

A manufacturing method of a cell unit according to the embodiment will now be described. Here, a description will be given on a manufacturing method of cell unit CU1 formed on the semiconductor substrate 11.

Figure 15:
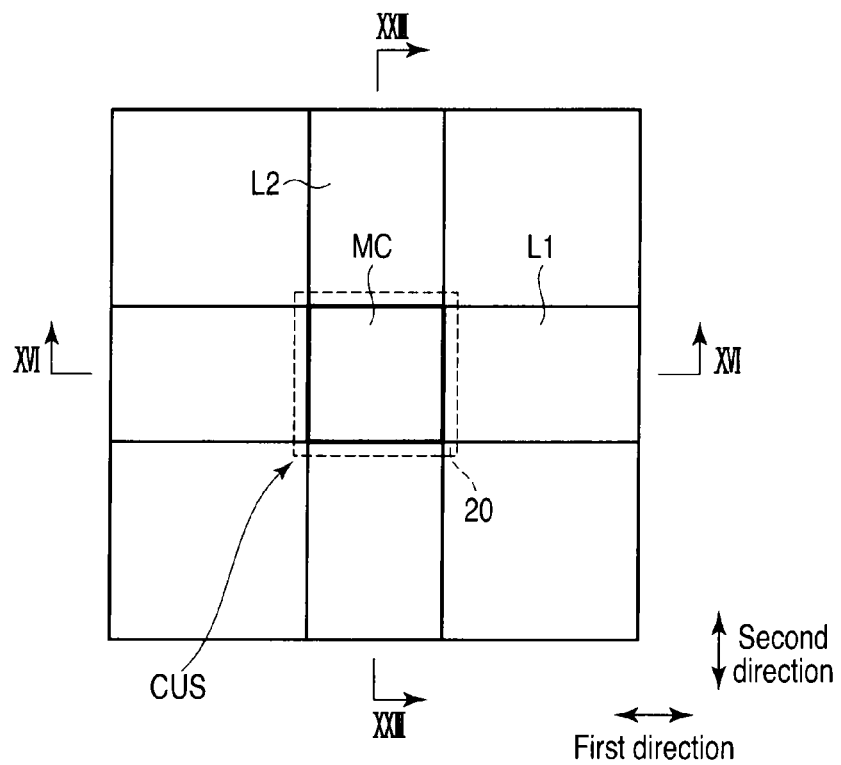
FIG. 15 is a top view of the cell unit in the embodiment.

FIG. 15 is a view showing a configuration of the cell unit according to the embodiment from a top face thereof. Each of FIGS. 16 to 22 is a cross-sectional view taken along line XVI-XVI in FIG. 15, and each of FIGS. 23 to 28 is a cross-sectional view taken along line XXIII-XXIII in FIG. 15. It is to be noted that FIG. 15 shows a plane of the finished cell unit, and it does not necessarily match with the cross-sectional view of a manufacturing process depicted in FIGS. 16 to 28.

As shown in FIG. 16, a first conductive layer (e.g., tungsten) L1 is formed on a semiconductor substrate 11 based on, e.g., chemical vapor deposition (CVD). It is to be noted that a circuit element such as a MOS transistor or an insulating film may be formed between the first conductive layer L1 and the semiconductor substrate 11.

As shown in FIG. 17, an electrode layer (e.g., a titanium nitride) 12 is formed on the first conductive layer L1 based on, e.g., CVD or sputtering.

Additionally, an n-type semiconductor layer 13 having an n-type impurity such as phosphorous (P) or arsenic (As) doped therein is formed on the electrode layer 12 based on CVD or the like. The electrode layer 12 formed on the first conductive layer L1 prevents the first conductive layer L1 and the n-type semiconductor layer 13 from reacting with each other.

An intrinsic semiconductor layer 14 is formed on the n-type semiconductor layer 13 based on, e.g., CVD. Further, a p-type semiconductor layer 15 having a p-type impurity such as boron (B) doped therein is formed on the intrinsic semiconductor layer 14 based on, e.g., CVD.

Here, a concentration of the n-type impurity contained in the n-type semiconductor layer 13 is set to $1 \times 10^{20}$ atoms/cm$^3$ or greater. Furthermore, a concentration of the p-type impurity contained in the p-type semiconductor layer 15 is set to $1 \times 10^{20}$ atoms/cm$^3$ or greater. Setting the concentration of each impurity to $1 \times 10^{20}$ atoms/cm$^3$ or greater enables reducing a leakage current at the time of applying a reverse bias while earning a forward current of a diode formed of these layers.

The n-type semiconductor layer 13 has a film thickness of 20 nm or less, the intrinsic semiconductor layer 14 has a film thickness of 60 to 120 nm or greater, and the p-Lype semiconductor layer 15 has a film thickness of 20 nm or less.

As shown in FIG. 18, an electrode layer (e.g., a titanium nitride) 16 is formed on the p-type semiconductor layer 15 based on, e.g., CVD or the sputtering. Moreover, a variable resistance film or a phase-change film 17 that becomes a memory element (variable resistance element or phase-change element) is formed on the electrode layer 16 based on, e.g., CVD.

Additionally, an electrode layer (e.g., a titanium nitride) 18 is formed on the variable resistance film or the phase-change film 17 based on, e.g., CVD or the sputtering. Further, a mask material (e.g., tungsten) 19 is formed on the electrode layer 18 based on, e.g., CVD.

Figure 19:
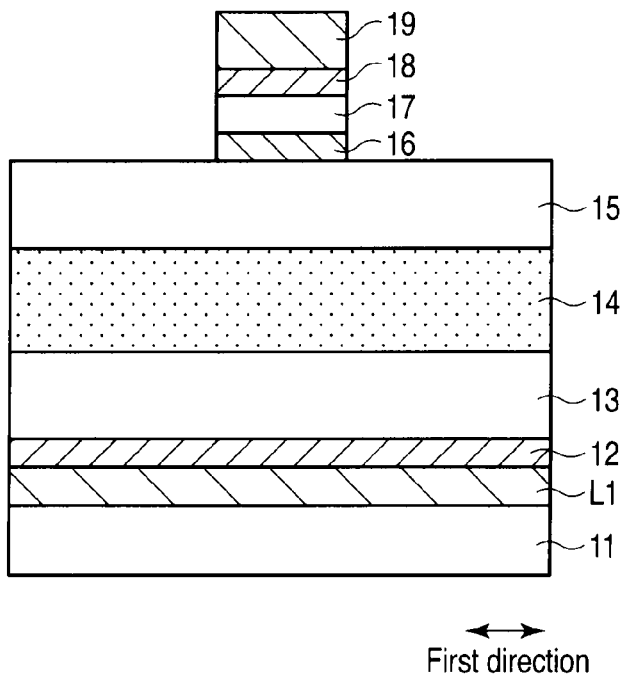

A resist pattern and the mask material 19 are utilized as a mask for etching to sequentially etch the mask material 19, the electrode layer 18, the variable resistance film or the phase-change film 17 and the electrode layer 16 based on a lithography method and anisotropic etching (e.g., reactive ion etching [RIE]) as shown in FIG. 19.

As a result, the mask material 19, the electrode layer 18, the variable resistance film or the phase-change film 17 and the electrode layer 16 form a line pattern extending in the second direction. Here, in case of manufacturing the shape depicted in FIG. 14A, the etching is further advanced to remove a part of an upper portion of the p-type semiconductor layer 15 (FIG. 30). As the etching in this case, overetching that completely removes the electrode layer 16 that is not covered with the mask material 19 may be used. As a result, the process can be simplified.

A silicon nitride film 20 is formed on the configuration depicted in FIG. 19, i.e., on the mask material 19 and the p-type semiconductor layer 15. At this time, a film thickness of the silicon nitride film 20 is 10 nm or less.

Figure 20:
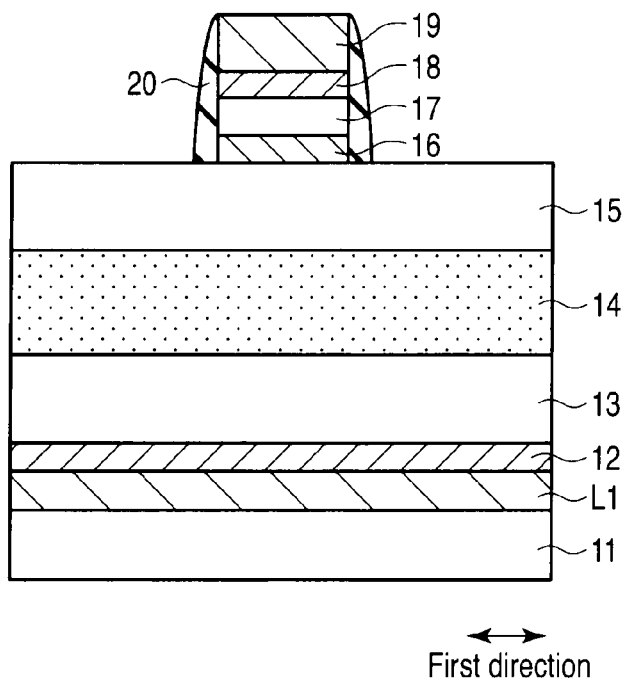
Figure 31:
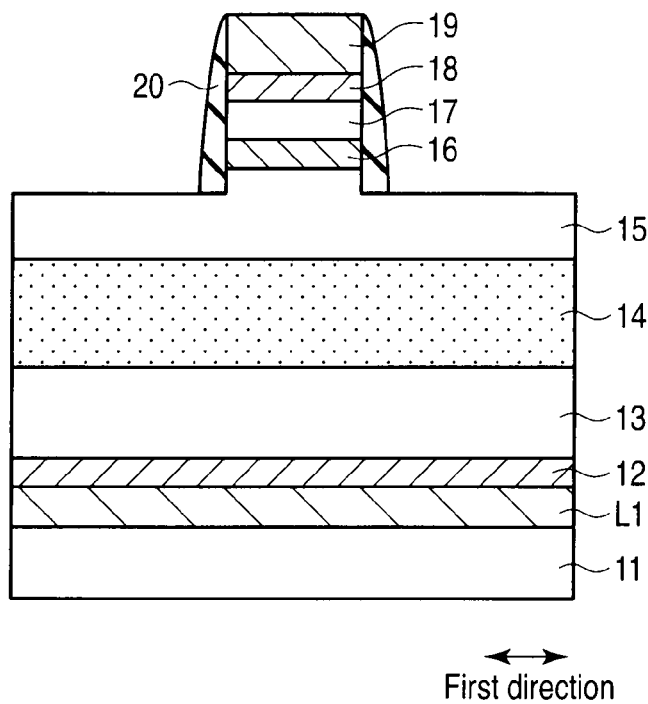

The silicon nitride film 20 is etched based on the anisotropic etching (e.g., RIE) to leave the silicon nitride film 20 on a side surface of the variable resistance film or the phase-change film 17, side surfaces of the electrode layers 16 and 18, and a side surface of the mask material 19 exposed in the first direction as shown in FIG. 20. That is, the silicon nitride film 20 as the sidewall film is formed on the side surface of the variable resistance film or the phase-change film 17 in the first direction. Here, in case the upper portion of the p-type semiconductor layer 15 is partially removed, a bottom face of the silicon nitride film 20 intrudes into the p-type semiconductor layer 15 from a top face thereof (FIG. 31).

Figure 21:
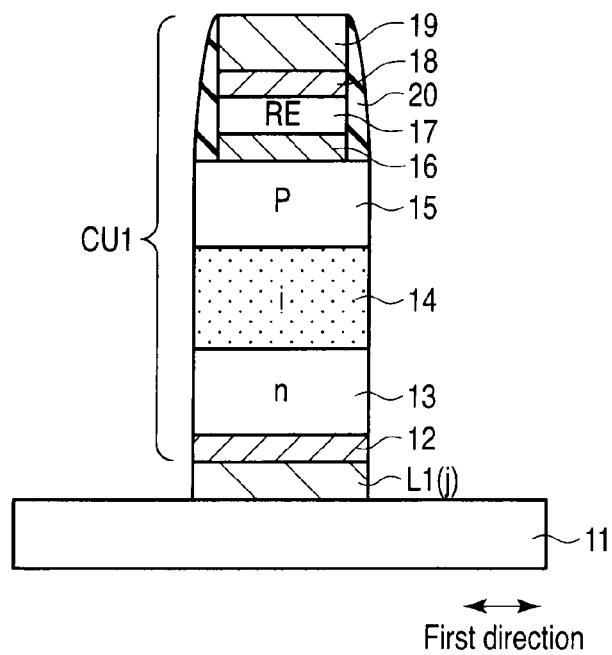

As shown in FIG. 21, the mask material 19 and the silicon nitride film 20 are utilized as a mask to sequentially etch the p-type semiconductor layer 15, the intrinsic conductive layer 14, the n-type semiconductor layer 13, the electrode layer 12 and the first conductive layer L1 based on the anisotropic etching (e.g., RIE). As a result, the first conductive layer L1 becomes a conductive line L1(j) extending in the second direction, and a side surface of cell unit CU1 in the first direction is formed on conductive line L1(j). Conductive line L1(j) becomes, e.g., a word line (or a bit line).

Figure 32:
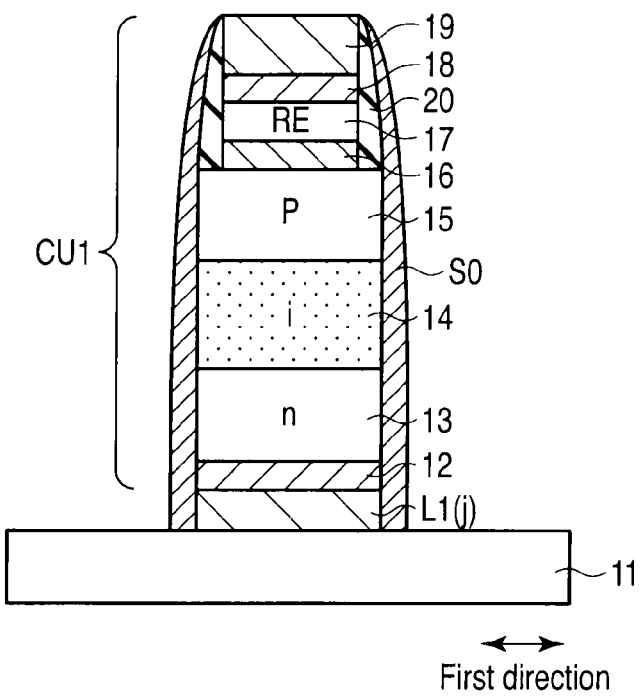
FIG. 32 is cross-sectional views showing a manufacturing method of the first modification of the cell unit in the embodiment.

Here, in case of manufacturing the shape depicted in FIG. 13B, a silicon oxide film is formed on the silicon nitride film 20 and on side surfaces of the p-type semiconductor layer 15, the intrinsic semiconductor layer 14, the n-type semiconductor layer 13, the electrode layer 12 and conductive line L1(j), and the silicon oxide film is left on the silicon nitride film 20 and on the side surfaces of the p-type semiconductor layer 15, the intrinsic semiconductor layer 14, the n-type semiconductor layer 13, the electrode layer 12 and conductive line L1(j) based on the anisotropic etching (FIG. 32).

Figure 22:
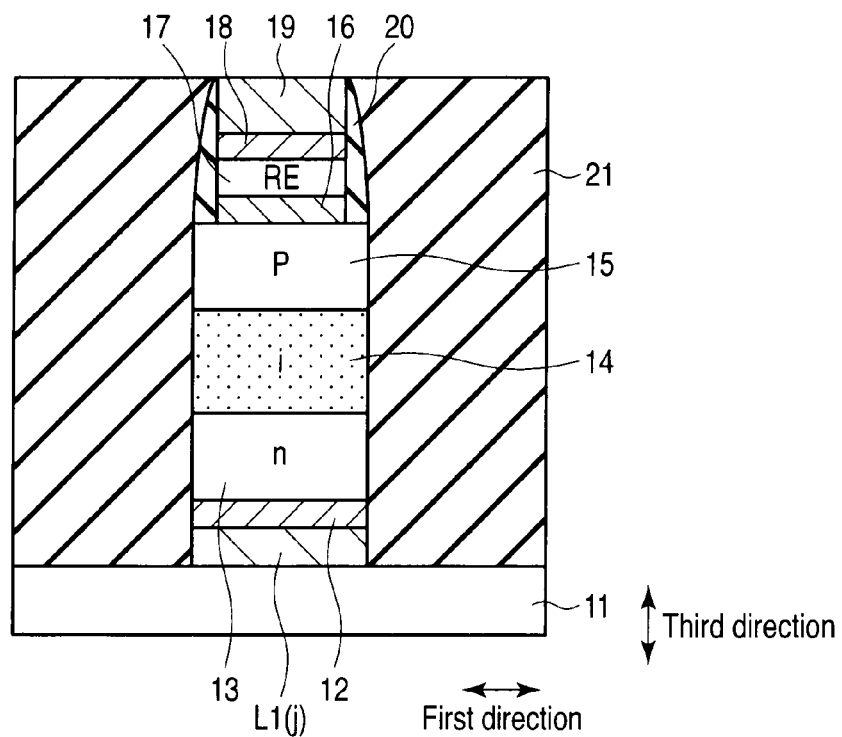

As shown in FIG. 22, an interlayer insulating film, e.g., a coating-type insulating film 21 is formed on the side surface of cell unit CU1 in the first direction based on, e.g., spin coating. That is, the coating-type insulating film 21 is formed on the silicon nitride film 20 and on the side surfaces of the p-type semiconductor layer 15, the intrinsic semiconductor layer 14, the n-type semiconductor layer 13, the electrode layer 12 and conductive line L1(j). In other words, the coating-type insulating film 21 is buried between the plurality of structures depicted in FIG. 21. The coating-type insulating film 21 consists of a silicon oxide coating film such as polysilazane formed by coating.

A top face of the coating-type insulating film 21 is flattened by, e.g., CMP so that the top face of the coating-type insulating film 21 and the top face of the mask material 19 can be arranged at substantially the same positions in the third direction. FIG. 23 shows a cross section taken along line XXIII-XXIII at this moment.

As shown in FIG. 23, the mask material 19 is formed on the electrode layer 18. The mask material 19 processes to a line pattern extending in the first direction. This mask material 19 is used as a mask to sequentially etch the coating-type insulating film 21, the electrode layer 18, the variable resistance film or the phase-change film 17 and the electrode layer 16 based on the lithography method and the anisotropic etching (e.g., RIP) as shown in FIG. 24. As a result, the electrode layer 18, the variable resistance film or the phase-change film 17 and the electrode layer 16 are separated from each other in the second direction.

Moreover, the silicon nitride film 20 is formed on the configuration depicted in FIG. 24, i.e., on the mask material 19 and the p-type semiconductor layer 15 based on CVD or the like. At this time, a film thickness of the silicon nitride film 20 is 10 nm or less.

The silicon nitride film 20 is etched based on the anisotropic etching (e.g., RIE) to leave the silicon nitride film 20 on the side surface of the variable resistance film or the phase-change film 17 and the side surfaces of the electrode layers 16 and 18 and the side surface of the mask material 19 exposed in the second direction. That is, the silicon nitride film 20 as a sidewall film is formed on the side surface of the variable resistance film or the phase-change film 17 in the second direction.

As shown in FIG. 26, the mask material 19 and the silicon nitride film 20 are utilized as a mask to sequentially etch the p-type semiconductor layer 15, the intrinsic conductive layer 14, the n-type semiconductor layer 13 and the electrode layer 12 based on the anisotropic etching (e.g., RIE).

As a result, a side surface of cell unit CU1 in the second direction is formed on conductive line L1(j). Consequently, the pillar-shaped cell unit CU1 including the variable resistance film or the phase-change film 17 and the diode is formed on conductive line L1(j). Additionally, a configuration that the silicon nitride film 20 is formed on all of the side surface of the variable resistance film or the phase-change film 17 alone can be obtained.

Here, in case of manufacturing the memory cell depicted in FIG. 13B, a silicon oxide film is formed on the silicon nitride film 20 and on the side surfaces of the p-type semiconductor layer 15, the intrinsic semiconductor layer 14, the n-type semiconductor layer 13, the electrode layer 12 and conductive line L1(j), and the silicon oxide film is left on the silicon nitride film 20 and on the side surfaces of the p-type semiconductor layer 15, the intrinsic semiconductor layer 14, the n-type semiconductor layer 13, the electrode layer 12 and conductive line L1(j) (like FIG. 31).

As shown in FIG. 27, an interlayer insulating film, e.g., a coating-type insulating film 21 is formed on the side surface of cell unit CU1 in the second direction based on, e.g., the spin coating. That is, the coating-type insulating film 21 is formed on the silicon nitride film 20 and on the side surfaces of the p-type semiconductor layer 15, the intrinsic semiconductor layer 14, the n-type semiconductor layer 13 and the electrode layer 12. In other words, the coating-type insulating film 21 is buried between the plurality of structures depicted in FIG. 26.

A top face of the coating-type insulating film 21 is flattened based on, e.g., the CMP so that the top face of the coating-type insulating film 21 and the top face of the mask material 19 are arranged at substantially the same positions in the third direction.

As shown in FIG. 28, a conductive line L2(i) extending in the first direction is formed on the mask material 19. Conductive line L2(i) becomes, e.g., a bit line (or a word line).

With the above-described process, cell unit CU1 according to the embodiment is manufactured. Further, repeating the above-described process enables manufacturing a three-dimensional cross-point memory cell array.

When the cell unit is formed by the above-described manufacturing method, the silicon nitride film can be formed on the side surface alone of the variable resistance film or the phase-change film 17 that becomes the memory element.

It is to be noted that, in the above-described manufacturing method, conductive line L2(i) may be formed by using a process of forming a side surface of a cell unit CU2 in the second direction that is formed on cell unit CU1. Furthermore, although the example of leaving the mask material 19 has been described, this mask material 19 may be removed after the etching process.

Moreover, although the coating-type insulating film 21 is formed on the side surface of cell unit CU1 by the coating, the silicon oxide film may be formed by CVD.

Additionally, the n-type semiconductor layer 13, the intrinsic semiconductor layer 14 and the p-type semiconductor layer 15 can be formed as amorphous silicon based on epitaxial growth. According to this embodiment, since a reverse current can be reduced as compared with a conventional configuration, the amorphous silicon through which a larger amount of reverse current than epitaxial silicon can be utilized. On the other hand, in case of forming silicon flows based on the epitaxial growth, there is adopted a method of forming openings in, e.g., conductive line L1(j) and the electrode layer 12 to expose the silicon substrate, then depositing amorphous silicon on this silicon substrate, and applying heat to realize epitaxy. Here, a thermal process required for growing epitaxial silicon is no longer required by using amorphous silicon for the rectification element. As a result, diffusion of the impurity, e.g., fluorine or hydrogen, into the memory element due to heat can be reduced.

When the n-type semiconductor layer 13, the intrinsic semiconductor layer 14 and the p-type semiconductor layer 15 constituting the diode are formed based on the epitaxial growth, rectification characteristics of the diode become excellent as compared with an example that the diode is formed based on CVD.

[2-8] Material Example

A material example utilized for the cell unit will now be described hereinafter.

Each of the p-type semiconductor layer, the intrinsic semiconductor layer and the n-type semiconductor layer constituting the p-i-n diode is selected from a group including Si, SiGe, SiC, Ge, C, GaAs, an oxide semiconductor, a nitride semiconductor, a carbide semiconductor and a sulfide semiconductor.

It is preferable for the p-type semiconductor layer (anode layer) to be formed of one of p-type Si, $TiO_2$, $ZrO_2$, $InZnO_x$, ITO, $SnO_2$ containing Sb, ZnO containing Al, $AgSbO_3$, $InGaZnO_4$ and $ZnO.SnO_2$.

It is preferable for the n-type semiconductor layer (cathode layer) to be formed of n-type Si, $NiO_x$, ZnO, $Rh_2O_3$, ZnO containing N, and $La_2CuO_4$.

A crystalline state of each of the p-type semiconductor layer, the intrinsic semiconductor layer and the n-type semiconductor layer may be any one of an amorphous state, a single-crystal state and a polycrystal state.

The conductive line that functions as the word line/bit line is formed of, e.g., W, WSi, NiSi or CoSi.

The electrode layer is formed of, e.g., Pt, Au, Ag, TiAlN, SrRuO, Ru, RuN, Ir, Co, Ti, TiN, TaN, LaNiO, Al, PtIrOx, PtRhOx, Rh or TaAlN. The electrode layer may have a function as a barrier metal layer or an adhesive layer at the same time.

The memory element is formed of, e.g., a two- or three-dimensional metal oxide.

[3] Conclusion

According to the embodiment, the impurity, e.g., fluorine or hydrogen can be prevented from diffusing into the memory element without degrading rectification characteristics of the rectification element. As a result, a semiconductor memory device that can exercise the performance as the cell unit to the full extent can be provided.

Further, as shown in FIG. 29B as a cross-sectional view taken along line XIII in FIGS. 29A and 29C as a cross-sectional view taken alone line XXV in FIG. 29A, the silicon nitride film 20 may be disposed on two side surfaces alone of the memory cell MC in the first direction rather than all side surfaces of the same. The impurity, e.g., fluorine or hydrogen can be prevented from diffusing into the memory element 17 from the coating-type insulating film 21 on at least the two side surfaces of the memory cell MC in the first direction. Furthermore, since the silicon nitride film is not formed to come into contact with the side surfaces of the rectification element, a reverse current in the rectification element is not increased.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first conductive line extending in a first direction;
a second conductive line extending in a second direction crossing the first direction;
a cell unit comprising a phase-change film and a diode including a p-type semiconductor layer and an n-type semiconductor layer which are connected in series between the first conductive line and the second conductive line;
a silicon nitride film formed on a side surface of the phase-change film, a bottom surface of the silicon nitride film being lower than a top surface of the diode; and
an insulating film which is formed on a side surface of the diode and has a smaller amount of charge trapping than the silicon nitride film;
wherein, when a boundary between the phase-change film and the silicon nitride film on the side surface of the phase-change film and the diode is cut along a plane parallel to the first direction and the second direction,
a cross-sectional area of the phase-change film and the silicon nitride film is equal to a cross-sectional area of the diode.

2. The device according to claim 1,
wherein, when the phase-change film and the diode is cut along a plane parallel to the first direction and the second direction,
a cross-sectional area of the phase-change film is smaller than a cross-sectional area of the diode.

3. The device according to claim 1,
further comprising a silicon oxide film formed to come into contact with the side surface of the diode.

4. The device according to claim 3,
wherein a film thickness of each of the silicon oxide film and the silicon nitride film is 10 nm or less.

5. The device according to claim 1,
wherein the p-type semiconductor layer and the n-type semiconductor layer are formed of amorphous silicon.

6. The device according to claim 1,
wherein the insulating film includes a coating-type oxide film formed by coating.

7. The device according to claim 1,
wherein the silicon nitride film is formed on the entire side surface of the phase-change film as seen from a top face thereof.

8. The device according to claim 1,
wherein the silicon nitride film is formed on opposed two side surfaces of phase-change film as seen from a top surface thereof.

9. A semiconductor memory device comprising:
a first conductive line extending in a first direction;
a second conductive line extending in a second direction crossing the first direction;
a cell unit comprising a phase-change film and a diode including a p-type semiconductor layer and an n-type semiconductor layer which are connected in series between the first conductive line and the second conductive line;
a silicon nitride film formed on a side surface of the phase-change film, a bottom surface of the silicon nitride film being lower than a top surface of the diode; and
an insulating film which is formed on a side surface of the diode and has a smaller amount of charge trapping than the silicon nitride film;
wherein the silicon nitride film is formed on the entire side surface of the phase-change film as seen from a top face thereof.

10. The device according to claim 9,
wherein, when the phase-change film and the diode is cut along a plane parallel to the first direction and the second direction,
a cross-sectional area of the phase-change film is smaller than a cross-sectional area of the diode.

11. The device according to claim 9,
further comprising a silicon oxide film formed to come into contact with the side surface of the diode.

12. The device according to claim 11,
wherein a film thickness of each of the silicon oxide film and the silicon nitride film is 10 nm or less.

13. The device according to claim 9,
wherein the p-type semiconductor layer and the n-type semiconductor layer is formed of amorphous silicon.

14. The device according to claim 9,
wherein the insulating film includes a coating-type oxide film formed by coating.

15. The device according to claim 9,
wherein the silicon nitride film is formed on opposed two side surfaces of the phase-change film as seen from the top face thereof.

* * * * *